(12) United States Patent
Li

(10) Patent No.: US 8,940,562 B1
(45) Date of Patent: Jan. 27, 2015

(54) FULLY-PRINTED CARBON NANOTUBE THIN FILM TRANSISTOR BACKPLANES FOR ACTIVE MATRIX ORGANIC LIGHT EMITTING DEVICES AND LIQUID CRYSTAL DISPLAYS

(71) Applicant: Atom Nanoelectronics, Los Angeles, CA (US)

(72) Inventor: Huaping Li, Los Angeles, CA (US)

(73) Assignee: Atom Nanoelectronics, Inc, Los Angeles, CA (US)

( * ) Notice: Subject to any disclaimer, the term of this patent is extended or adjusted under 35 U.S.C. 154(b) by 0 days.

(21) Appl. No.: 14/336,614

(22) Filed: Jul. 21, 2014

Related U.S. Application Data

(60) Provisional application No. 62/006,381, filed on Jun. 2, 2014.

(51) Int. Cl.
| | |
|---|---|
| *H01L 21/00* | (2006.01) |
| *G09G 3/34* | (2006.01) |
| *H01L 51/00* | (2006.01) |
| *H01L 27/28* | (2006.01) |
| *H01L 27/32* | (2006.01) |
| *G02F 1/1368* | (2006.01) |
| *B82Y 40/00* | (2011.01) |
| *B82Y 15/00* | (2011.01) |

(52) U.S. Cl.
CPC ......... *H01L 51/0004* (2013.01); *H01L 27/283* (2013.01); *H01L 27/3274* (2013.01); *G02F 1/1368* (2013.01); *B82Y 40/00* (2013.01); *Y10S 977/845* (2013.01); *B82Y 15/00* (2013.01); *Y10S 977/938* (2013.01); *G02F 2001/13685* (2013.01); *H01L 2227/323* (2013.01)
USPC ............. 438/28; 257/E21.499; 257/E33.056; 257/E51.006; 345/107; 977/845; 977/938

(58) Field of Classification Search
CPC ............. H01L 51/0004; H01L 27/283; H01L 27/3274
USPC .................. 257/E21.499, E33.056, E51.005; 438/28; 245/107
See application file for complete search history.

(56) References Cited

U.S. PATENT DOCUMENTS

2009/0050879 A1 * 2/2009 Yamaga et al. ................. 257/40

* cited by examiner

*Primary Examiner* — David S Blum

(57) ABSTRACT

The present disclosure provides the ability to produce backplanes for AMLCD and AMOLED. Specifically, each and every component of the backplanes can be printed. Depending on the resolution and screen size of the displays, backplanes can include over a million different components that must be printed that include components of the thin film transistor (TFT) and electrodes to address each of those TFTs. Even a slight misregistry of components during printing can lead to failure of one or more pixels, potentially rendering the entire display unsuitable for use. The present disclosure provides the ability to reproducibly and accurately print each and every component of the backplane for both AMLCD and AMOLED. The ability to completely print backplanes provides numerous advantages, such as reduced costs, improved throughput, more environmental friendliness, and the like.

30 Claims, 31 Drawing Sheets

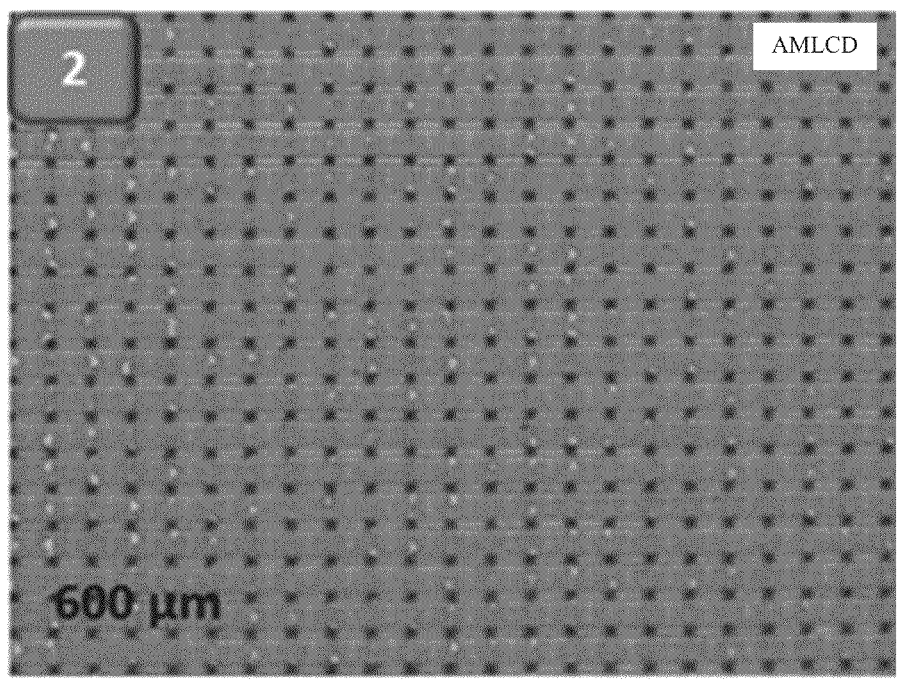
FIG. 8B(1)

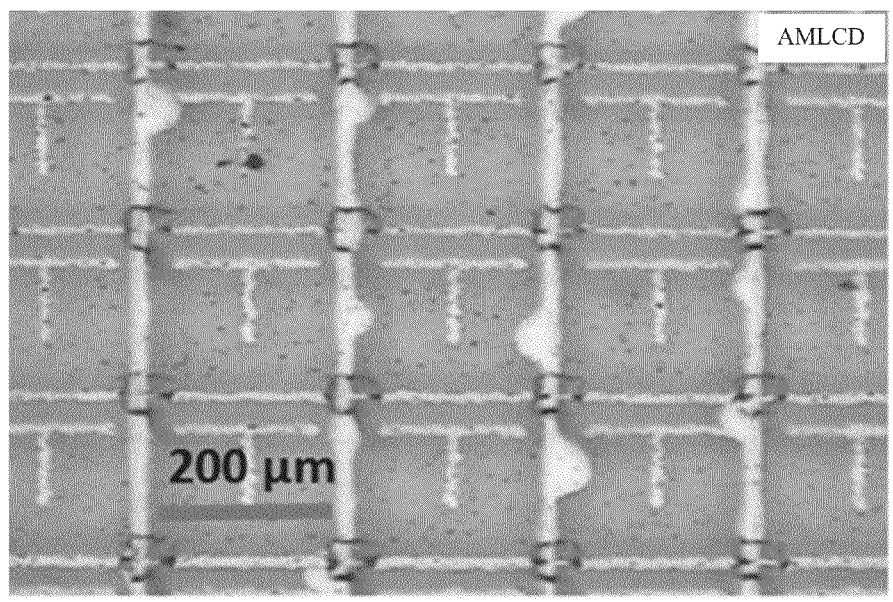
FIG. 8B(2)

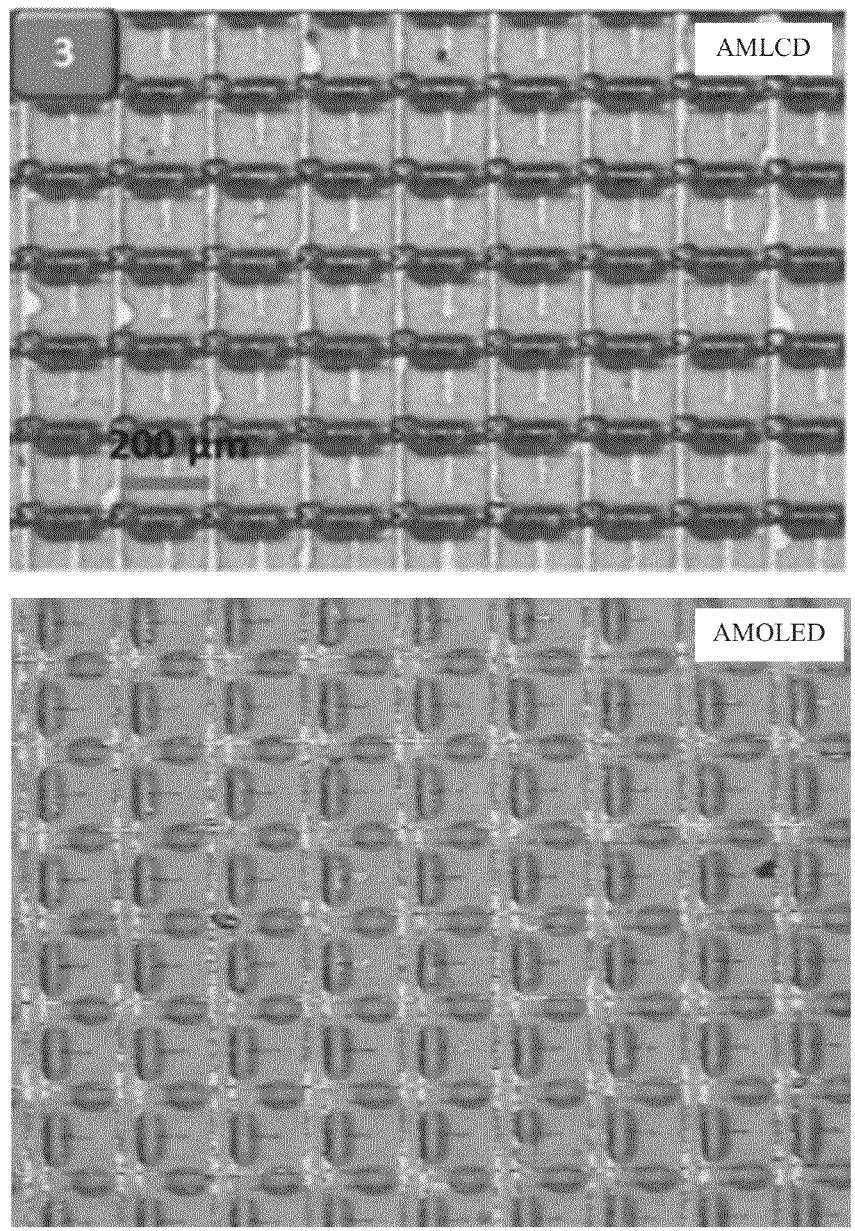
FIG. 8D(1)

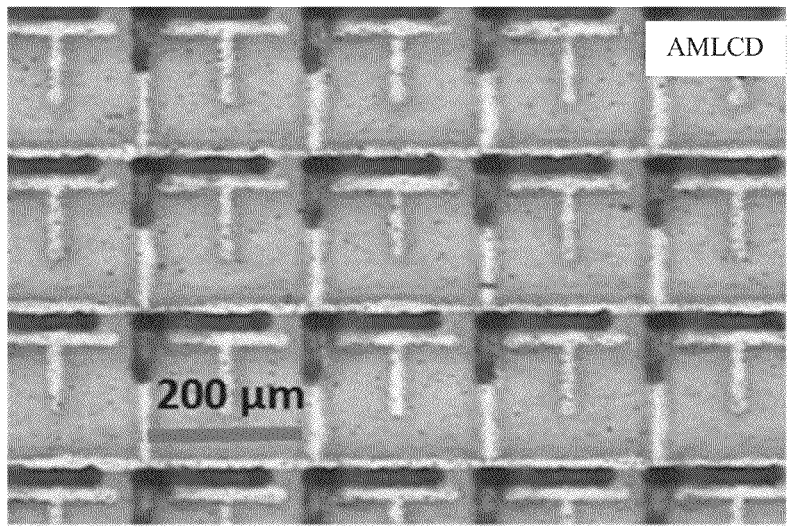
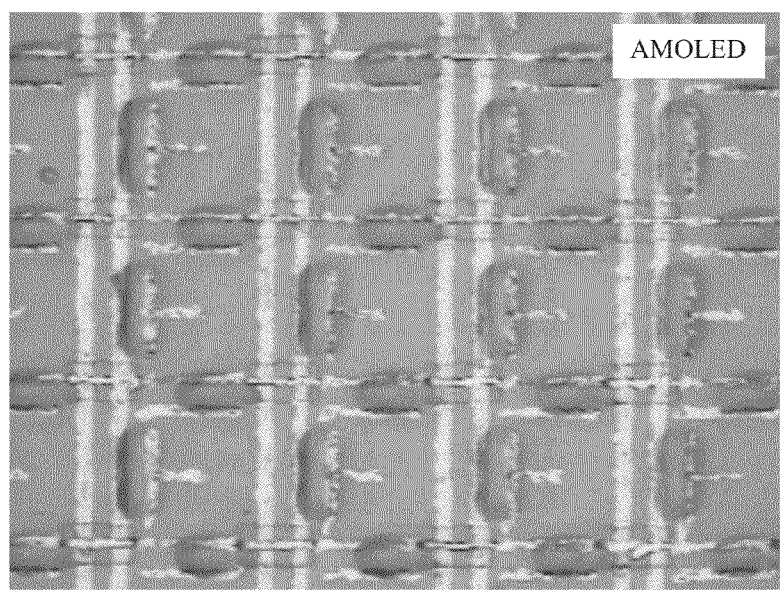
FIG. 8D(2)

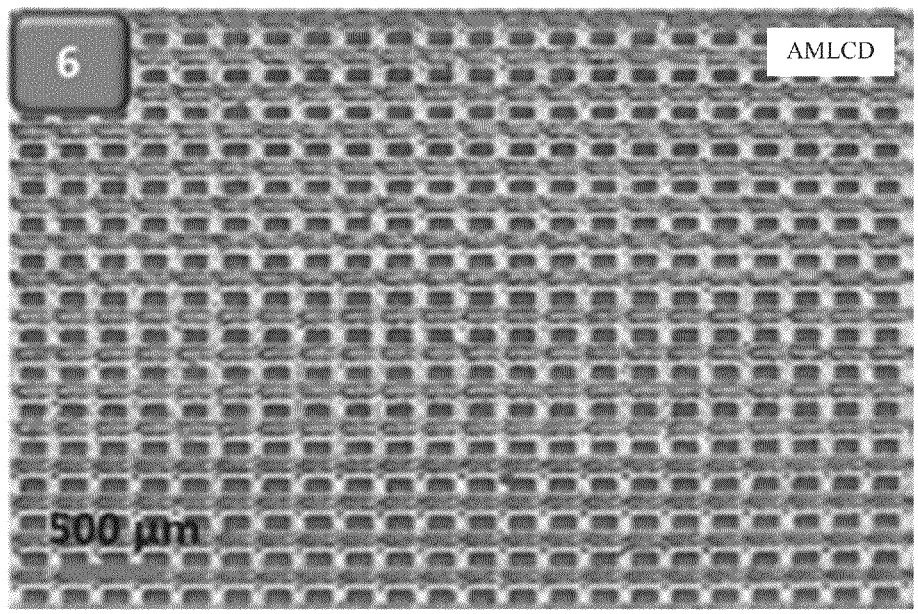
FIG. 8G(1)

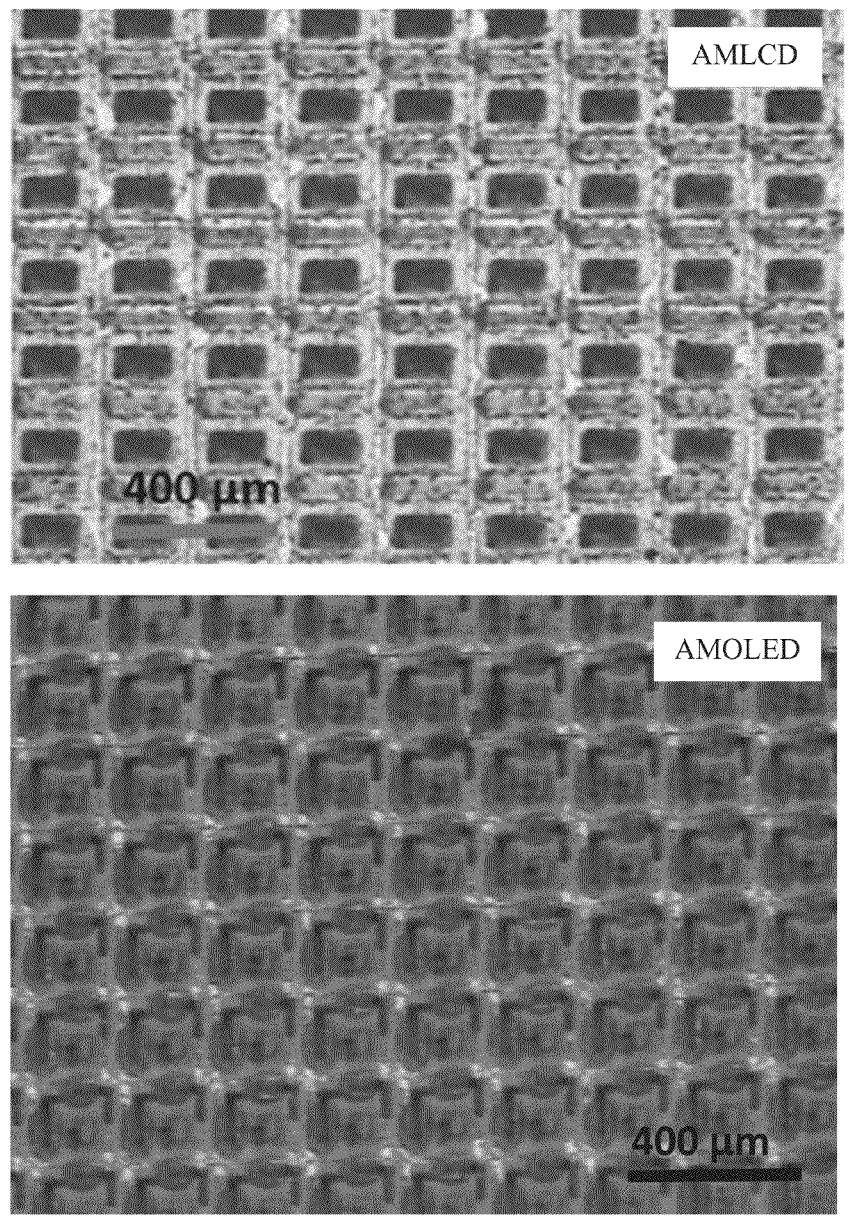
FIG. 8G(2)

FULLY-PRINTED CARBON NANOTUBE THIN FILM TRANSISTOR BACKPLANES FOR ACTIVE MATRIX ORGANIC LIGHT EMITTING DEVICES AND LIQUID CRYSTAL DISPLAYS

CROSS-REFERENCE TO RELATED APPLICATIONS

This application claims the benefit of U.S. Provisional Patent Application No. 62/006,381, filed Jun. 2, 2014, all of which is incorporated herein by reference in its entirety.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

INCORPORATION BY REFERENCE

All patents, patent applications and publications cited herein are hereby incorporated by reference in their entirety in order to more fully describe the state of the art as known to those skilled therein as of the date of the invention described herein.

FIELD OF THE INVENTION

The present application relates to backplanes for active matrix devices. More particularly, the present application relates to fully printed carbon nanotube thin film transistor backplanes for active matrix organic light emitting devices (AMOLED) and active matrix liquid crystal displays (AM-LCD).

BACKGROUND

In early days of flat panel display, technological innovation was driven by several trends such as image quality, screen size, portability and form factor. More recently, new drivers in flat panel display technology are product differentiation, flexibility, 3 D, transparency, system-on-panel, power savings, interconnectivity and screen size, and new front plane technologies. These new functional needs are beyond the performance limits of many existing technologies, requiring alternative solutions.

The backplane technology largely sets the limits of display industry. The backplane, consisting of thin film transistors ("TFTs") that act as pixel switches, is responsible for turning the individual pixels ON and OFF. There are already many different mature and available, even fast-emerging, thin film transistors, including amorphous silicon, nanocrystalline silicon, low temperature polysilicon, solution processed or thermal evaporated organic semiconductor, various metal oxide, and the like.

Yet, none of current TFTs offers a one-technology-fits-all-needs solution, because each of the existing platforms has a different set of characteristics suitable for different applications.

Printing electronic components on flexible substrate with liquid inks is an attractive approach for achieving flexible and low-cost circuitry for applications such as bendable displays. Semiconductor-enriched single-walled carbon nanotubes (SWNTs) have been used to fabricate thin-film transistors on mechanically flexible substrates; however the methodology did not produce fully printed TFTs suitable for use in display backplanes. Methods and devices using fully integrated printing technology are desired.

SUMMARY

To date, no SWCNT TFT backplanes that are fully printed have been made. Printing provides numerous advantages, such as low-cost, low environmental impact and large area fabrication due to the small number of process steps, small amount of materials utilized and high throughput.

The methods and processes described herein provide low voltage SWCNT TFT backplanes using a printing process and liquid-based inks.

In certain embodiments, a method for depositing an active matrix thin film transistor backplane on a substrate is provided. The thin film transistor backplane includes a plurality of thin film transistors and addressing electrodes. In certain embodiments, the method includes: printing a first gold electrode layer on the substrate, the first gold electrode layer comprising a plurality of gold lines; printing an insulating layer over printed gold lines, the layer comprising insulating patches at intervals along the conductive lines; printing a second gold electrode layer over the printed insulating layer, the second gold electrode layer comprising a plurality of gold lines perpendicular to the gold lines of the printed first gold electrode layer to form pixel cells and electrodes to provide a transistor channel at each pixel cell; selectively printing semiconducting carbon nanotubes in each of said plurality of transistor channels, wherein the semiconducting carbon nanotubes have a single chirality; selectively printing a dielectric over each of the printed semiconducting carbon nanotubes, wherein said dielectric comprises an ionic gel; printing gate electrodes over said dielectric to form a plurality of thin film transistor, wherein said gate electrode comprises a conducting polymer; and printing pixel electrodes in electrical connection with an electrode of said thin film transistors.

In certain embodiments, the method further includes printing a protective layer over at least said first and second conductive layers and said plurality of thin film transistors.

In certain embodiments, the semiconducting carbon nanotubes include single-walled carbon nanotube.

In certain embodiments, the semiconducting carbon nanotubes include 65 single-walled carbon nanotubes (SWCNT), 91 SWCNT, 83 SWCNT, 65 SWCNT, 73 SWCNT, 75 SWCNT, 102 SWCNT, 84 SWCNT, 76 SWCNT, and 92 SWCNT.

In certain embodiments, the semiconducting carbon nanotubes include 65 single-walled carbon nanotubes.

In certain embodiments, the 65 single-walled carbon nanotubes are contained in a solution having a concentration of 0.001 to 0.1 mg/mL in 1%-5% SDS aqueous solution.

In certain embodiments, the method further includes washing said active channel material with acid vapor.

In certain embodiments, the method further includes washing said active channel material with an alcohol.

In certain embodiments, the method further includes heating said active channel material at a temperature of 105° C.~140° C.

In certain embodiments, the each of the printing is carried out using an aerosol jet printing, ink jet printing, screen printing, flexography printing, or combinations thereof.

In certain embodiments, the gold nanoparticles have a size of that ranges from about 1-20 nm and the gold nanoparticles are dispersed in an organic solvent at a concentration of about 5-60 weight %).

In certain embodiments, the organic solvent includes xylene, toluene, chlorobenzene, dichlorobenzene, trichlorobenzene, triethylbenzene, chloronaphthalene or combinations thereof.

In certain embodiments, the insulating layer includes a dielectric polymer, dielectric oxides, dielectric nitride, or combinations thereof.

In certain embodiments, the dielectric polymer includes polyimide, fluorinated polymer, poly(methyl methacrylate), or combinations thereof.

In certain embodiments, the dielectric polymer includes polyimide and the polyimide is dispersed in an N-Methyl-2-Pyrrolidone, N,N-dimethylformide, or combinations thereof.

In certain embodiments, the dielectric includes a gelling polymer and an ionic liquid in the ratio from 1:5 to 10:1.

In certain embodiments, the dielectric includes a gelling polymer and 1-alkyl-3-methyl-imidozalium counter anion.

In certain embodiments, the alkyl in the 1-alkyl-3-methyl-imidozalium counter anion is represented by $C_nH_{2n+1}$, wherein is an integer between 1 and 6.

In certain embodiments, the counter anion in the 1-alkyl-3-methyl-imidozalium counter anion includes a fluoride, a bromide, a hexafluorophosphate, a trifluoroacetate, or a trifluoromethylsulfonylimide (TFSI).

In certain embodiments, the dielectric includes a gelling polymer and 1-ethyl-3-methyl-imidozalium trifluoromethylsulfonylimide (EMIM TFSI).

In certain embodiments, the dielectric includes polyfluorinated resin and 1-ethyl-3-methylimidezolium bis(trifluoromethyl)sulfonylimide (EMIM TFSI) in an organic ionic liquid.

In certain embodiments, the polyfluorinated resin includes a sulfonated tetrafluorotethylene based fluoropolymer-copolymer.

In certain embodiments, the dielectric includes polystyrene-co-poly(methyl methacrylate)-co-polystyrene (PS-b-PMMA-b-PS) and 1-ethyl-3-methylimidezolium bis (trifluoromethyl)sulfonylimide (EMIM TFSI) in an organic ionic liquid.

In certain embodiments, the conductive polymers for use as a gate electrode include poly(3,4-ethylenedioxythiophene) polystyrene sulfonate (PEDOT:PSS) aqueous solution.

In certain embodiments, the protective layer includes a dielectric polymer, a dielectric oxide, or a dielectric nitride.

In certain embodiments, the dielectric polymer includes polyimide, fluorinated polymer, Cytop, poly(methyl methacrylate), or combinations thereof.

In certain embodiments, the pixel electrodes are printed using metal nanoparticles or conductive polymers.

In certain embodiments, the conductive polymers include poly(3,4-ethylenedioxythiophene): polystyrene sulfonate (PEDOT:PSS) in an aqueous solution.

In certain embodiments, a backplane display prepared according to the method described herein is provided, wherein the display includes at least 1000 TFTs, each TFT having a dimension of 100 µm×100 µm to 200 µm×200 µm.

In certain embodiments, the TFTs have a mobility of greater than or equal to 100 cm$^2$/V-s.

In certain embodiments, the TFTs have a mobility of 100-150 cm$^2$/V-s.

In certain embodiments, the yield of TFTs is greater than 99%.

In certain embodiments, the ON/OFF switching ratio of the TFTs is greater than $5\times10^5$.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which:

FIGS. 8A through 8G (2) shows the detailed step by step printing procedure of the fully printed 5 cm×5 cm SWCNT TFT backplane with pixel size of 200 µm×200 µm in accordance with certain embodiments.

DETAILED DESCRIPTION OF THE INVENTION

The present disclosure provides the ability to produce backplanes for AMLCD and AMOLED. Specifically, each and every component of the backplanes can be printed. Depending on the resolution and screen size of the displays, backplanes can include over a million different components that must be printed that include components of the thin film transistor (TFT) and electrodes to address each of those TFTs. Even a slight misregistry of components during printing can lead to failure of one or more pixels, potentially rendering the entire display unsuitable for use. The present disclosure provides the ability to reproducibly and accurately print each and every component of the backplane for both AMLCD and MOLED. The ability to completely print backplanes provides numerous advantages, such as reduced costs, improved throughput, more environmental friendliness, and the like.

FIGS. 1 and 2 show schematic illustrations of two different types of backplanes used for active matrix liquid crystal displays (AMLCD) and active matrix organic light emitting devices (AMOLED), respectively.

Figure 1A:
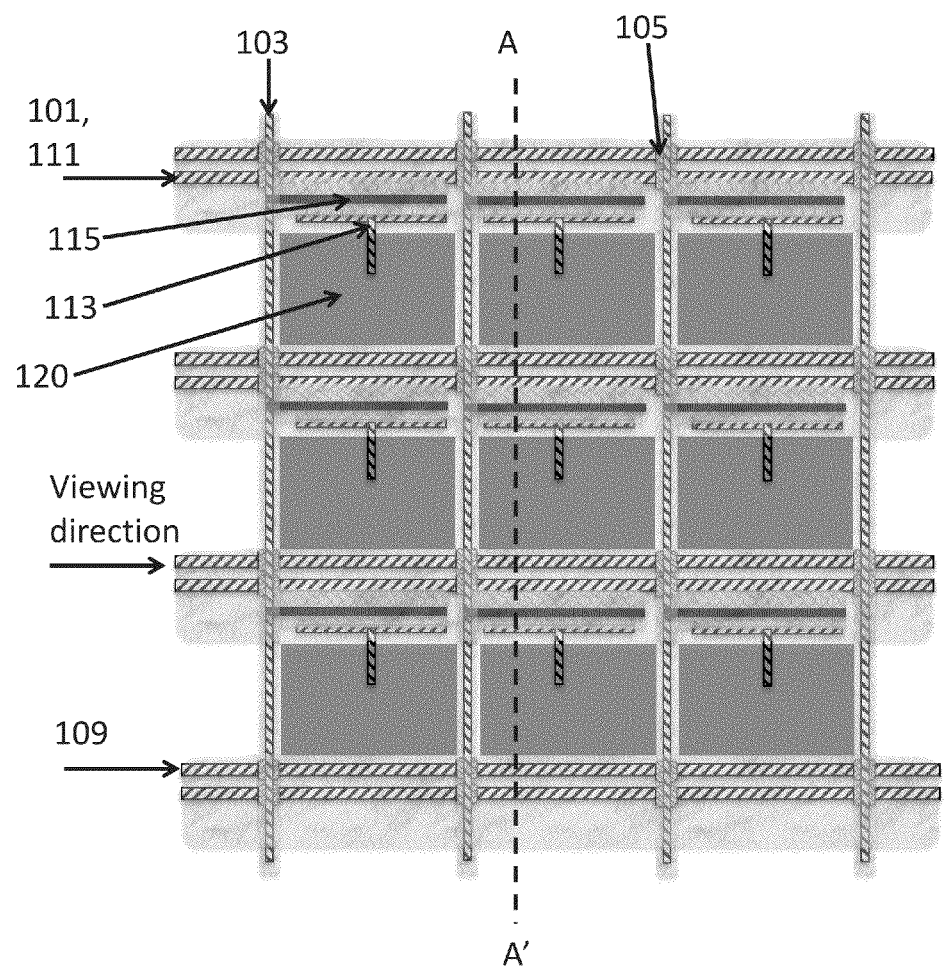
FIG. 1A is a plan view diagram of an active matrix liquid crystal display (AMLCD) backplane in accordance with certain embodiments.
Figure 1B:
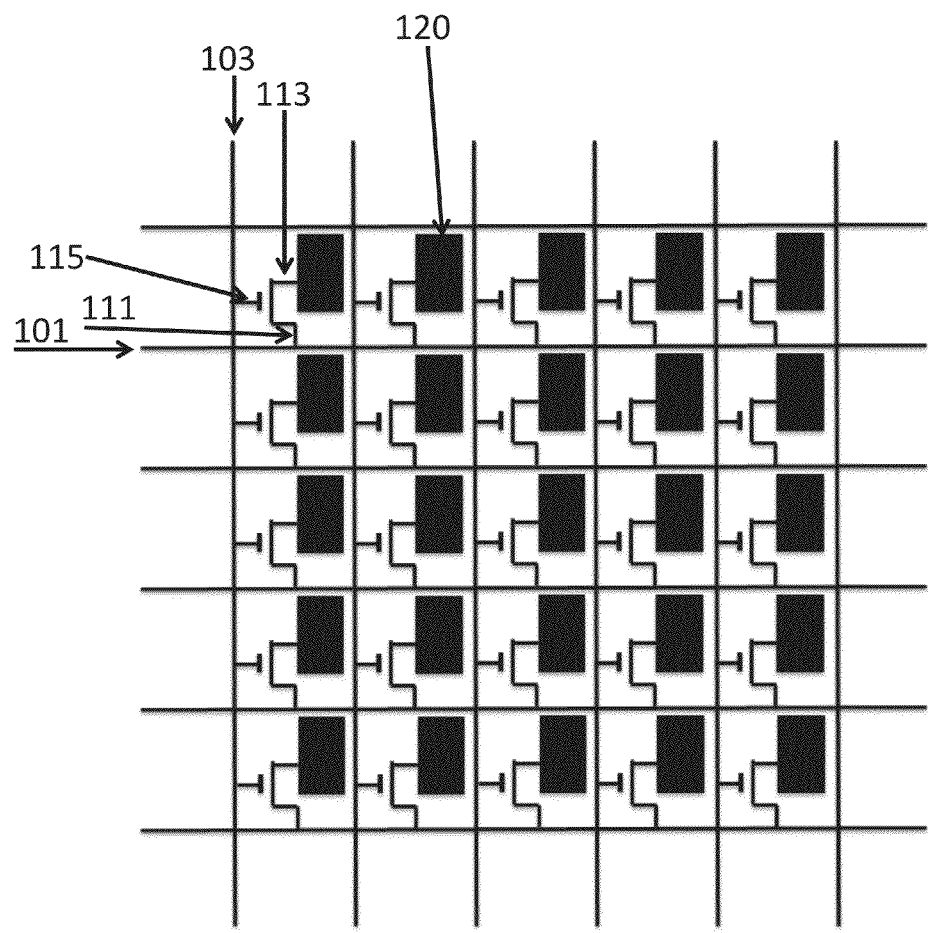
FIG. 1B is a circuit diagram of an AMLCD backplane in accordance with certain embodiments.

As shown in FIG. 1A, AMLCD backplanes include a plurality of conductive lines on a first electrode layer 101 (e.g., data lines) and a plurality of conductive lines on a second electrode layer 103 (e.g., scan lines), wherein the first and second electrode layers are separated by insulating material 105 that are located around the regions where the conductive lines cross one another. The backplane may further contain a common line 109. The intersection of the plurality of conductive lines 101 and 103 define an array of pixels, where each pixel contains a thin film transistor (TFT). The TFT 110 further includes a source electrode 111, a drain electrode 113 and a gate electrode 115. In certain embodiments, the gate electrode 115 can be connected to one of the plurality of conductive lines 103 and source electrode 111 can be connected to one of the plurality of conductive lines 101. In certain embodiments, the source electrode 111 and the conductive line 101 are integrally connected. The drain electrode 113 is connected to a pixel electrode 120 that can activate the particular pixel of the AMLCD. FIG. 1B shows a schematic circuit diagram of such an AMLCD backplane device, in which the circuit elements labels correspond to the description above.

Figure 1C:
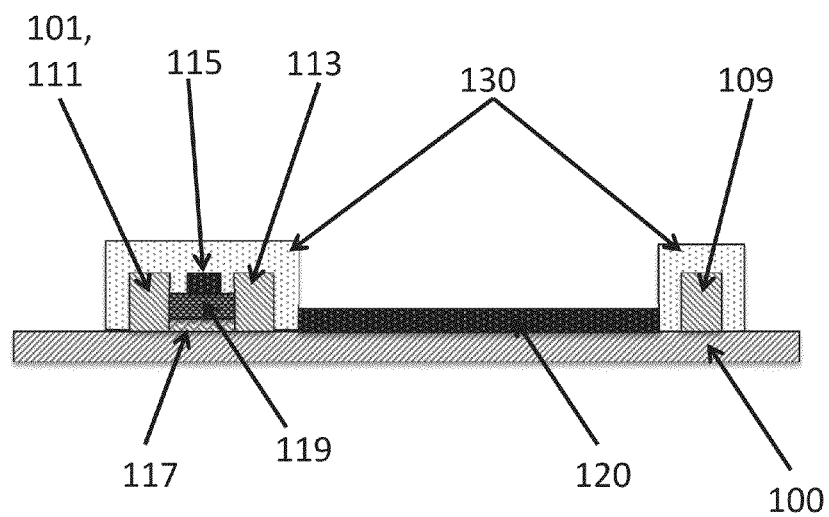
FIG. 1C is a cross-sectional diagram of an AMLCD backplane in accordance with certain embodiments.

FIG. 1C shows a cross-sectional view of one pixel of the AMLCD backplane along the dotted line A-A' shown in FIG. 1A and viewed along the direction indicated by the arrow in FIG. 1A. As shown, AMLCD backplane can be printed over a substrate 100. The substrate 100 can be any suitable material, such as a plastic, glass, silicon, ceramic and the like. In certain embodiments, the substrate 100 can be a display glass, a flexible glass, a display glass, glass slides, a silicon wafer including a thin film wafer and amorphous wafer, gallium wafer, gallium nitride wafer, polyimide films, such as Kapton® film, or other flexible plastics.

Printed electrodes 101 and 103 (not shown) are deposited over the substrate 100. The electrodes are printed according to a variety of geometries. In one or more embodiments, electrodes 101 and the source electrode 111 are deposited as a single integral electrode. In other embodiments, source electrode 111 can be printed separately and spaced apart from electrode 101 and can be electrically connected to the horizontal electrode 101. The electrodes 111, 113 (as well as other electrodes, such as electrodes 103 and 115) can be made using any suitable material, such as gold, silver, copper, aluminum, and the like. In certain embodiments, the electrodes can have a thickness that ranges from about 100 nm to about several microns and a width that ranges from about 10 to about 20 microns. In certain embodiments, the sheet resistance of the electrodes are less than $1\Omega/\square$.

Printed active layer using carbon nanotubes 117 is disposed between the electrodes 111 and 113 and over the substrate 100, but not over the electrodes 111 and 113. In certain embodiments, the carbon nanotubes are semiconducting nanotubes. In certain embodiments, the nanotubes have a single chirality. In certain embodiments, the nanotubes have a purity that is greater than 95%, such as greater than 99%. In certain embodiments, the nanotubes have a single diameter. In certain embodiments, the nanotubes are semiconducting nanotubes having a single chirality and/or a single diameter. Some exemplary semiconducting carbon nanotubes having a single chirality and/or a single diameter include 65, 91, 83, 65, 73, 75, 102, 84, 76, 92 SWCNTs and the like.

A printed dielectric material 119 is disposed over the carbon nanotubes 117. The dielectric material 119 can be any suitable material, such as polyimide, polyfluorinated resin, para-methoxymethamphetamine (PMMA), $BaTiO_3$, $Si_3N_4$, $SiO_2$, poly(4-vinylphenol), 4,4'-(hexafluoroisopropylidene) diphthalic anhydride, 1-ethyl-3-methyl-imidozalium trifluoromethylsulfonylimide (EMIM TFSI), poly[(2-ethyldimethylammonioethyl methacrylate ethyl sulfate)-co-(1-vinylpyrrolidone)] (polyquaternium), self-assembled monolayers of n-octadecylphosphonic acid, and combinations thereof.

A printed gate electrode 115 is disposed over the dielectric material 119. In certain embodiments, the gate electrode 115 can be any conductive material, such as metal, conductive polymer, and the like. In certain embodiments, the gate electrode 115 can be printed using metal nanoparticle suspension or a conductive polymer solution. For example, poly(3,4-ethylenedioxythiophene) polystyrene sulfonate (PEDOT:PSS) aqueous solution can be utilized to print the gate electrode 115. The printing of gate electrode 115 can provide a thin film transistor (TFT) device.

Printed pixel electrode 120 is located over the substrate 100 and in electrical connection to the drain electrode 113. As shown, drain electrode 113 may contain a leading electrode that connects to the pixel electrode 120. In certain embodiments, the pixel electrode can be any conductive material, such as metal, conductive polymer, and the like. In certain embodiments, the pixel electrode 120 can be printed using metal nanoparticle suspension or a conductive polymer solution. For example, poly(3,4-ethylenedioxythiophene) polystyrene sulfonate (PEDOT:PSS) aqueous solution can be utilized to print the pixel electrode 120.

Printed protective layer 130 forms a protective layer over any desired regions, such as the regions over the TFT devices, regions over conductive electrodes 101, 103, 111, 113, 115, and the like. In certain embodiments, all the regions, except for a preselected portion of the pixel electrode 120 to allow driving the AMLCD pixel, are covered with a protective layer 130. Any suitable material can be utilized as the protective layer 130, such as dielectric polymers, or dielectric oxides, nitrides and the like.

Figure 2A:
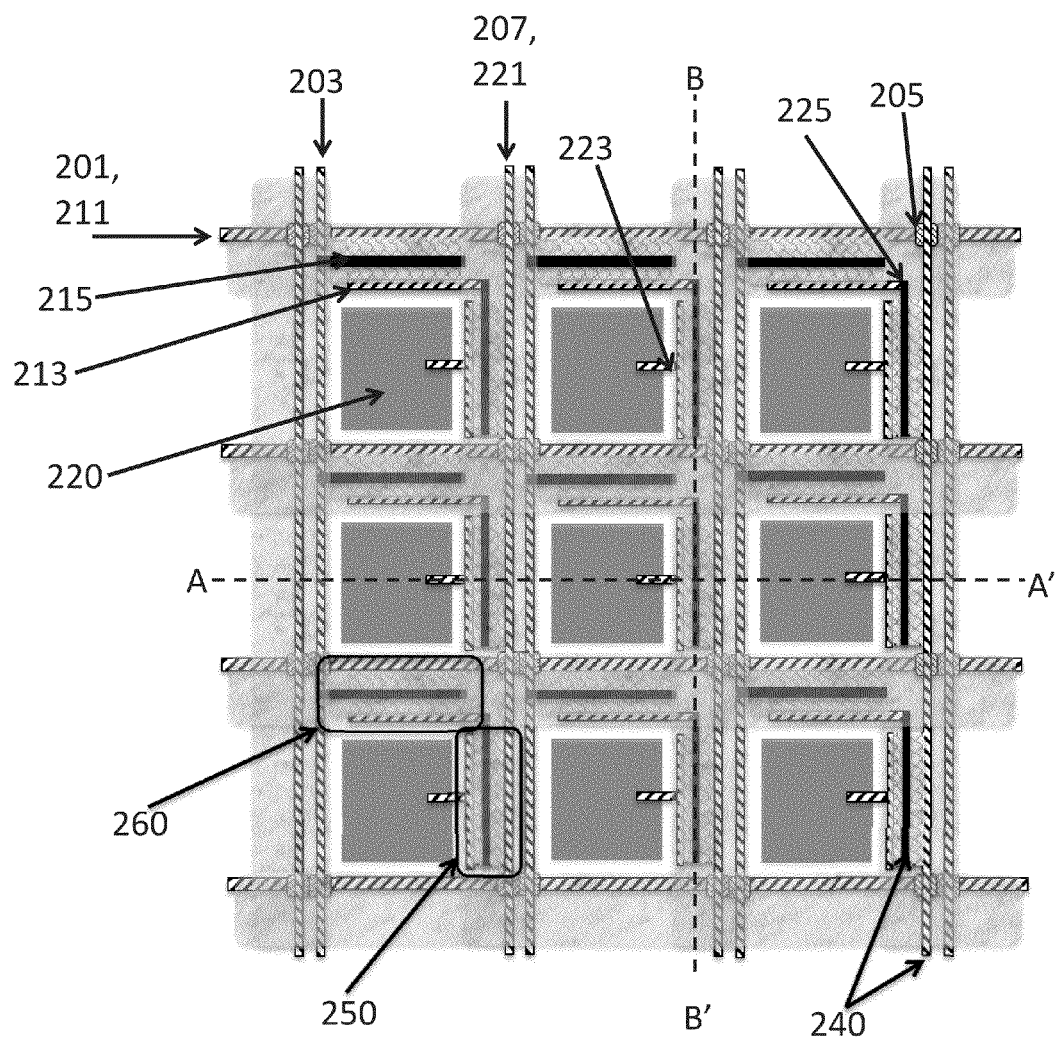
FIG. 2A is a plan view diagram of an active matrix organic light emitting device (AMOLED) backplane in accordance with certain embodiments.
Figure 2B:
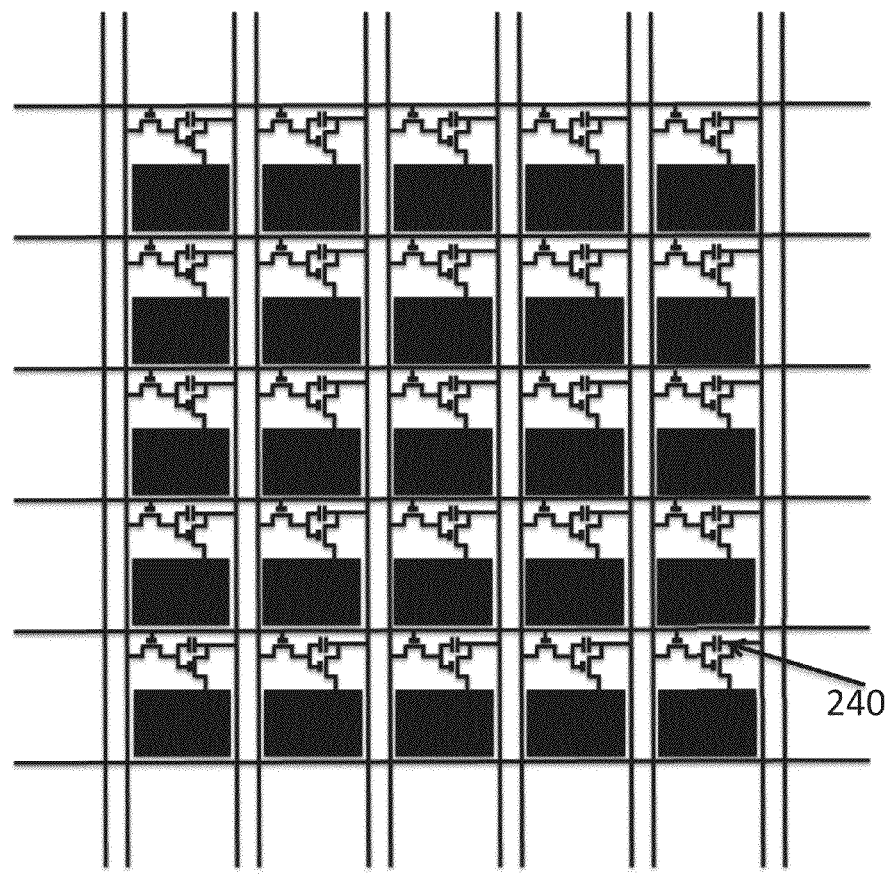
FIG. 2B is a circuit diagram of an AMOLED backplane in accordance with certain embodiments.

As shown in FIG. 2A, AMOLED backplanes include at least two different types of TFTS: a switching TFT 250 and a driving TFT 260. More specifically, AMOLED backplanes include a plurality of conductive lines on a first electrode layer 201 (e.g., data lines) and a plurality of conductive lines on a second electrode layer 203 (e.g., scan lines) and 207 (e.g., power lines), wherein the first and second electrode layers are separated by insulating material 205 that are located around the regions where the conductive lines cross one another. The intersection of the plurality of conductive lines 201 and 203/207 define an array of pixels, where each pixel contains two thin film transistors (TFT) 210a and 210b. The TFT 210a further includes a source electrode 211, a drain electrode 213 and a gate electrode 215. In certain embodiments, the gate electrode 215 of TFT 210a can be connected to one of the plurality of conductive lines 203 and source electrode 211 of TFT 210a can be connected to one of the plurality of conductive lines 201. In certain embodiments, the source electrode 211 and the conductive line 201 are integrally connected. The drain electrode 213 of TFT 210a is connected to a gate electrode 225 of TFT 210b. In turn, the source electrode 221 of TFT 210b can be connected to electrode 207 (either electrically or integrally) and the drain electrode 223 of TFT 210b can be connected to the pixel electrode 220 that can activate the particular pixel of the AMOLED. FIG. 2B shows a schematic circuit diagram of such an AMOLED backplane device, in which the circuit elements labels correspond to the description above. FIGS. 2A and 2B also depict the capacitor 240 that forms between gate electrode 225 and electrode 207.

Figure 2C:
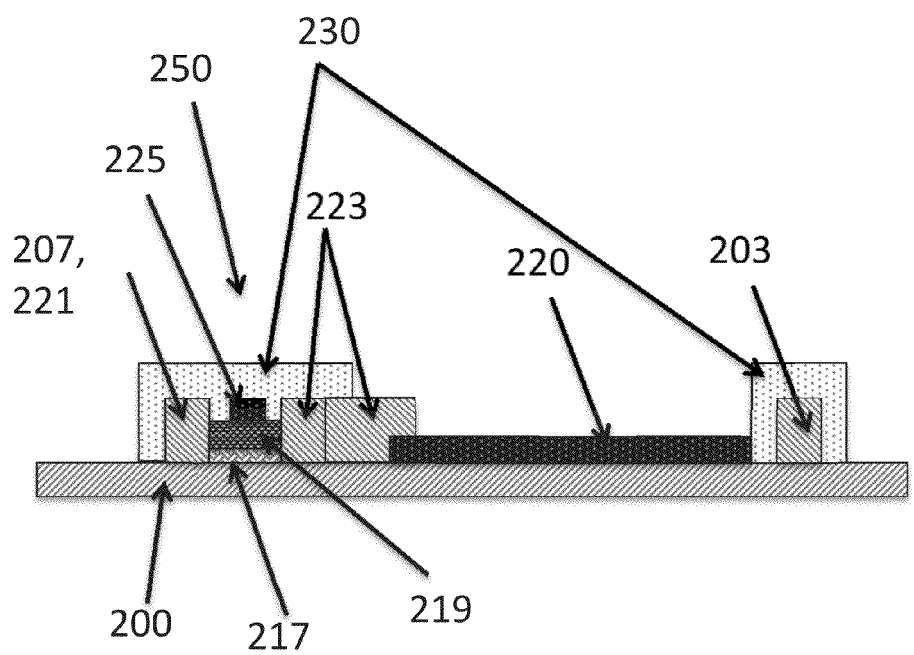
FIGS. 2C and 2D are a cross-sectional diagrams of an AMOLED backplane in accordance with certain embodiments.
Figure 2D:
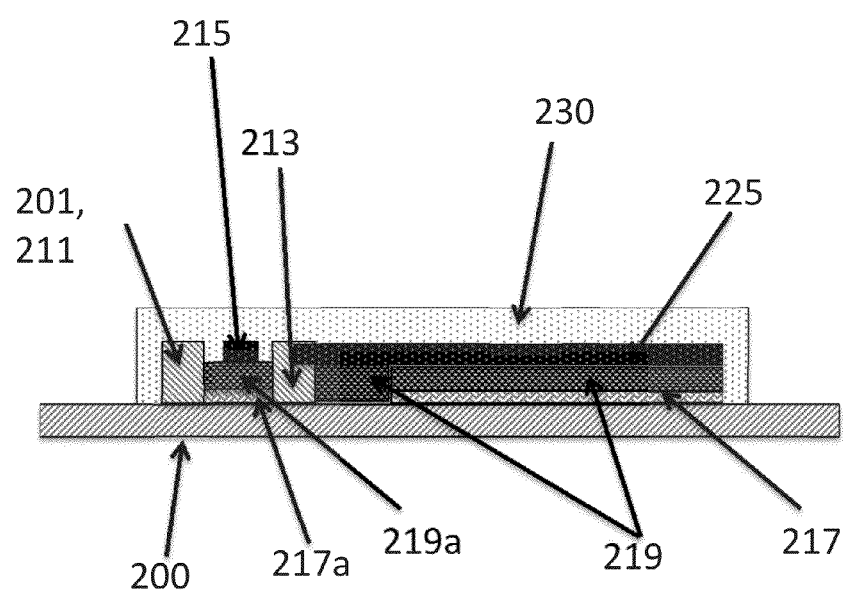

FIGS. 2C and 2D show cross-sectional diagrams of one pixel of the AMOLED backplane along lines A-A' and B-B' respectively. Along the cross-section of A-A', substrate 200, active material 217, dielectric 219, gate electrode 225, electrode 207/221, electrode 223, pixel electrode 220, electrode 203, and protective layer 230 are arranged as shown in FIG. 2C. Along the cross-section of B-B', substrate 200, active materials 217 of the switching TFT 250, active material 217a of the driving TFT 260, dielectrics 219 and 219a, gate electrodes 215 and 225, and protective layer 230 are shown in FIG. 2D. Similar materials, such as described above with respect to the AMLCD backplanes, can be utilized.

Figure 3:
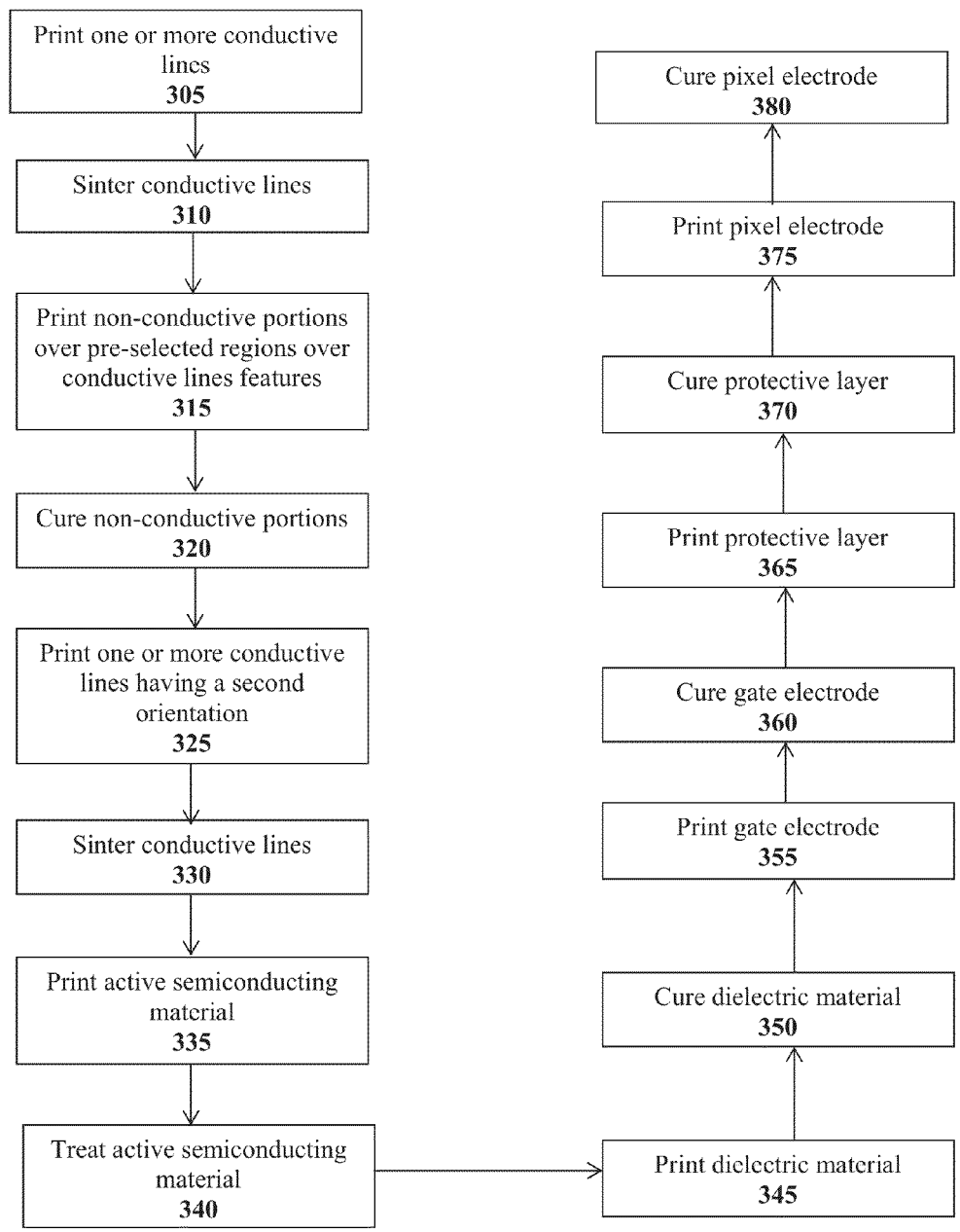
FIG. 3 is a flow chart of the printing process of the backplane in accordance with certain embodiments.

FIG. 3 illustrates an exemplary flow diagram that can be utilized to print the backplane devices in accordance with certain embodiments. Many different types of printing techniques can be utilized. In certain embodiments, printing can be carried out using an aerosol jet printing, ink jet printing, screen printing, flexography printing, or combinations thereof. Any printing technique that can reliably and reproducibly print overlay registration of 1-2 μm can be utilized. In certain embodiments, numerous TFTs can be printed, such as greater than 1000, 10,000, 100,000, 1,000,000, or more TFTs, each having a size that is larger than 100 μm×100 μm can be printed. In certain embodiments, each TFT has a size that is about 100 μm×100 μm to about 200 μm×200 μm.

In certain embodiments, aerosol jet printing can be utilized, where the aerosol jet printing is carried out using the following parameters; ultrasonic atomization at a voltage that range from 20~48 V, pneumatic atomization to generate aerosol in diameter of 1~5 μm, a sheath gas flow of 20~50 cubic centimeters per minute, a carrier gas flow of 10-20 cubic centimeters per minute, a nozzle diameter of 60 μm, 100 μm, 150 μm, 200 μm, 250 μm, or 300 μm, and a fiducial management with overlay registration of 1~2 μm. In certain embodiments, the carrier gas may include ultra-pure nitrogen, argon or combinations thereof.

In 305, one or more conductive lines can be printed, such as electrodes 101, 111 shown in FIG. 1A or electrodes 201, 211 shown in FIG. 2A. In certain embodiments, the electrodes can be printed in a first orientation. In certain embodiments, the electrodes can be printed using a conductive polymer solution or suspension. In certain embodiments, the electrodes can be formed by depositing metal particles (e.g., micro or nanoparticles) and sintering the particles together. For example, metal particles may be metal nanoparticles, such as gold nanoparticles, silver nanoparticles, copper nanoparticles, aluminum, nanoparticles, or combinations thereof.

In one or more embodiments, the nanoparticle solution is a gold nanoparticles solution. Silver nanoparticles can be used for certain circuitry applications, however, silver is an electropositive material and silver and other non-noble metals may interact unfavorably with the gate dielectric. In particular, where the gate dielectric is an ionic gel, silver can dissolve in the electrolyte under positive bias. Certain applications have proposed the use of conductive organics for source and drain electrodes. While conductive organics can be used in the printing of electronic circuitry and TFTs, it is not readily integratable with the printing of backplane data and scan lines. In consideration of these factors, in preferred embodiments, gold nanoparticles are used in preparation of fully printed backplane TFTs for display applications.

In certain embodiments, gold nanoparticles can be utilized where gold nanoparticles have a size of 4 nm and the gold nanoparticles are dispersed in an organic solvent at a concentration of 60 weight %. Some suitable organic solvents include xylene, toluene, chlorobenzene, dichlorobenzene, trichlorobenzene, triethylbenzene, chloronaphthalene or combinations thereof.

In 310, the conductive lines from 305 can be sintered. In certain embodiments, the conductive lines can be sintered at about 250° C.~400° C. for 30~60 minutes.

In 315, non-conductive portions can be printed on preselected regions over the conductive lines printed and sintered in 305 and 310. Some exemplary non-conductive materials include a dielectric polymer, such as polyimide (e.g., CORN XLS), fluorinated polymers (e.g, TEFLON, CYTOP), poly (methyl methacrylate), or combinations thereof; dielectric oxides, such as silica, alumina, hafnia, and the like; dielectric nitride, such as $Si_3N_4$, $C_3N_4$, GaN, and the like; or combinations thereof. The dielectric material can be solvated in suitable organic solvents, such as N-Methyl-2-Pyrrolidone, N,N-dimethylformide, or combinations thereof. In certain embodiments, the non-conductive material can be solvated having a concentration of about 1 mg/mL, which can vary depending upon the thickness desired. For example, higher concentrations can be utilized to deposit thicker material and lower concentrations can be utilized to deposit thinner material.

In 320, the non-conductive portions printed in 315 can be cured to form insulating materials, such as insulating material 105 shown in FIG. 1A or 205 in FIG. 2A. For example, the printed non-conductive portions can be annealed at a temperature in the range of 200° C.-300° C. for 10~30 minutes.

In 325, one or more conductive lines can be printed, such as electrodes 103, 113 shown in FIG. 1A or electrodes 203, 213, 223 shown in FIG. 2A. The electrodes can be printed using a nanoparticle solution and have a second orientation that is different from the first orientation of the conductive lines printed in 305. The conductive ink utilized to print such additional conductive lines (e.g., electrodes 103, 113, 203, 213, 223) can be similar to those used in 305.

In 330, the conductive lines from 325 can be sintered. In certain embodiments, the conductive lines can be sintered at about 250° C.~400° C. for 30~60 minutes.

In 335, active materials 117 shown in FIG. 1C or 217/217a shown in FIGS. 2C/2D, such as a semiconducting material (e.g., carbon nanotubes, such as single-walled carbon nanotubes (SWCNT)) can be printed. In one or more embodiments, the semiconducting materials is a highly purified single chirality SWCNT. A single-wall carbon nanotube (SWCNT) can be viewed as a hollow cylinder formed by rolling up a graphene sheet. The direction and magnitude of the rolling vector define the chiral angle and diameter, respectively, of the resulting nanotube. These geometric parameters determine the electrical properties of the nanotube. For example, SWCNTs can be either metallic (M) or semiconducting (S) depending on their chiral angles and diameters. Moreover, the energy bandgap of S-SWCNTs is inversely proportional to the nanotube diameter. SWCNTs having a population of nanotubes with well-defined structures and electrical properties are required for backplane displays having good ON/OFF current ratios.

In one or more embodiments, the SWCNT solutions used in the printing of the active layer contains greater than 98% SWCNT having diverse chirality and being free of metallic impurities. In other embodiments, the SWCNT solutions used in the printing of the active layer contains greater that 99% SWCNT having diverse chirality. In other embodiments, the SWCNT solutions used in the printing of the active layer contains greater that 99.5% SWCNT having diverse chirality. Some suitable semiconducting carbon nanotubes include 65 SWCNT, 91 SWCNT, 83 SWCNT, 65 SWCNT, 73 SWCNT, 75 SWCNT, 102 SWCNT, 84 SWCNT, 76 SWCNT, and 92 SWCNT. This high-purity ink ensures that good ON/OFF current ratios are achieved easily for printed CNT transistors without subsequent processing or chemical treatment to eliminate metallic tubes or metallic catalyst impurities. Furthermore, the printed CNT networks are intrinsically ambipolar and exhibit effective mobilities of both holes and electrons greater than 100 $cm^2$N·s and up to 150 $cm^2$/V·s.

The active material can be printed using a suitable dispersion, such as SWCNTs contained in a solution having a concentration of about 0.001-0.1 (e.g., 0.001, 0.005, 0.01, 0.05, or 0.1) mg/mL in 1%-5% (e.g., 1%, 2%, 3%, 4%, 5%) sodium dodecyl sulfate (SDS) aqueous solution. In certain embodiments, additives and/or processing aids that provide desired properties during printing can be added. For example, methanol can be added to control the droplet size.

In 340, the printed carbon nanotubes can be treated as desired. In certain embodiments, the printed carbon nanotubes can be washed with an acid vapor, such as HCl, $HNO_3$, $H_2SO_4$, $H_3PO_4$, formic acid, acetic acid, propanoic acid, $C_nH_{2n+1}COOH$, $C_{n+1}H_{2n+1}COOH$ (n=1, 2, . . . ) and the like. Use of a vapor phase wash provides minimal disturbance of the deposited carbon nanotubes. For example, the printed carbon nanotubes can be washed for 10~30 minutes. In certain embodiments, the printed carbon nanotubes can be washed with an alcohol, such as isopropyl alcohol, for 10~30 minutes. In certain embodiments, the printed carbon nanotubes can be heated at a temperature of 105° C.~140° C. for 1030 minutes.

In 345, a dielectric material 119 shown in FIG. 1C or 219/219a shown in FIGS. 2C/2D can be printed over the printed and treated carbon nanotubes. In certain embodiments, dielectric is printed using a material selected from the group consisting of polyimide, polyfluorinated resin, para-methoxymethamphetamine (PMMA), $BaTiO_3$, $Si_3N_4$, $SiO_2$, poly(4-vinylphenol), 4,4'-(hexafluoroisopropylidene) diphthalic anhydride, 1-ethyl-3-methyl-imidozalium trifluoromethylsulfonylimide (EMIM TFSI), poly[(2-ethyldimethylammonioethyl methacrylate ethyl sulfate)-co-(1-vinylpyrrolidone)] (polyquaternium), self-assembled monolayers of n-octadecylphosphonic acid, and combinations thereof. In certain embodiments, the dielectric includes a polyfluorinated resin, such as containing Nafion 117 or Nafion NR50, and Solarpur 1-ethyl-3-methylimidezolium bis (trifluoromethyl)sulfonylimide (EMIM TFSI) in an organic solvent. Some exemplary organic solvent includes methanol, ethanol, propanol, iso-propanol, n-butanol, fluorinated alkanes, and so on.

In one or more embodiments, ionic gels incorporating room temperature ionic liquids are used as the dielectric material. Ionic gels are attractive candidates for display TFTs due to their high capacitance (10 $\mu F/cm^2$) and carrier accumulation (>$10^{14}$/cm). Capacitance is independent of the thickness of the ionic gel. The high capacitance enables a reduction in the applied gate voltage required to switch the TFT and also enable high source-to-drain conductances and high ON currents. In certain embodiments, the ionic gels include a gelling polymer and an ionic liquid. In certain embodiment, the ratio of the gelling polymer to the ionic liquid can range from about 1:5 to about 10:1 (e.g., 1:5, 1:3, 1:2, 1:1, 2:1, 5:1 or 10:1).

In certain embodiments, the ionic gels can include a gelling polymer and 1-alkyl-3-methyl-imidozalium counter anion. In certain embodiments, the alkyl group can be $C_nH_{2+1}$, wherein is an integer between 1 and 6. In certain embodiments, the counter anion can be a fluoride, a bromide, a hexafluorophosphate, a trifluoroacetate, or a trifluoromethylsulfonylimide (TFSI). An exemplary ionic gels employs 1-ethyl-3-methylimidezolium bis (trifluoromethyl)sulfonylimide (EMIM TFSI) as the ionic liquid and the gelling polymer can be polystyrene-co-poly(methyl methacrylate)-co-polystyrene (PS-b-PMMA-b-PS). In other embodiments, the gelling polymer can be a fluoropolymer resin. While not bound by any particular mode of operation, it is believed that the polyfluororesin can react with the imide of the ionic liquid to form a crosslinked network and immobilize the ionic liquid with the polyfluoropolymer resin, according to the reaction shown in Scheme I.

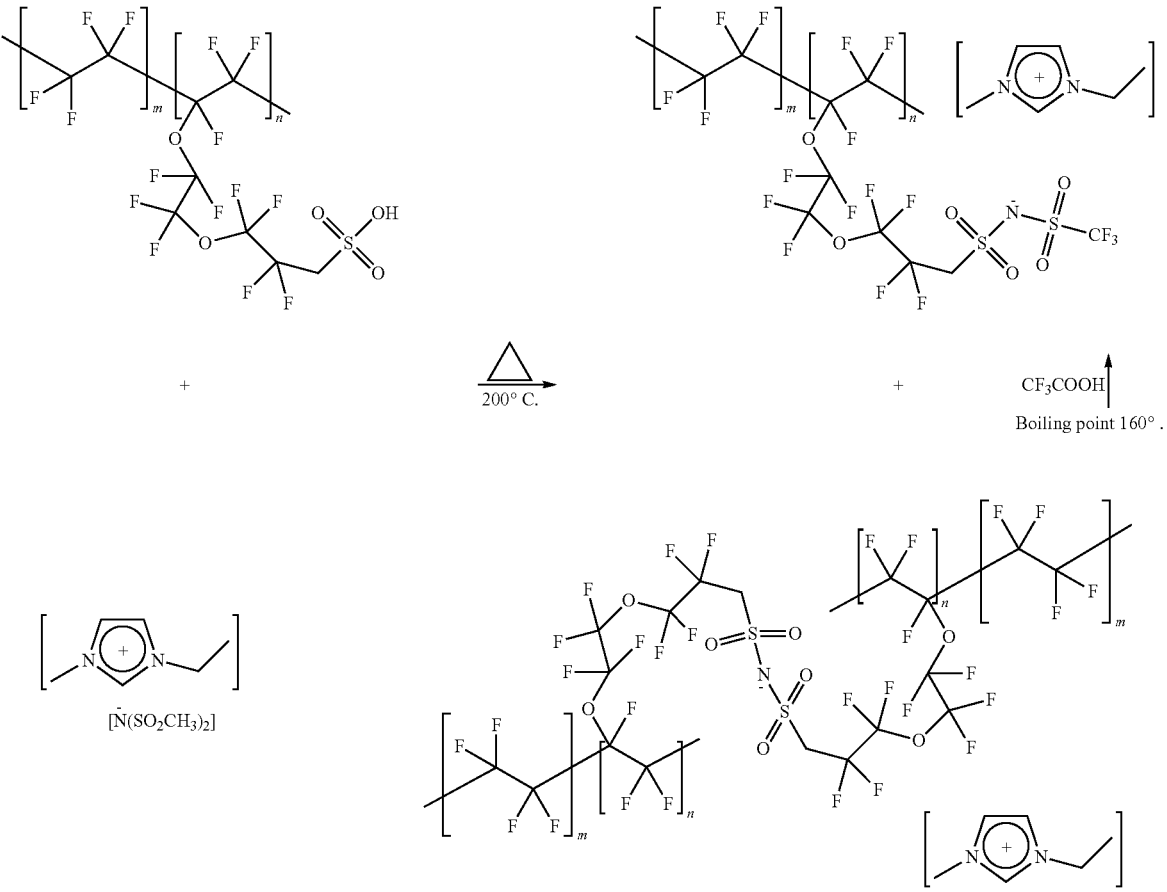

The ionic gels have large ionic conductivity, small submicrosecond polarization time and a wide electrochemical window. They are chemically inert, optically transparent and thermally stable, e.g., to greater than 200° C.

In 350, the dielectric material printed in 345 can be cured. In certain embodiments, the dielectric layer is annealed at a temperature of in the range of 200° C.-300° C. for 10 30 minutes.

In 355, a gate electrode 115 shown in FIGS. 1A/1C or 215 shown in FIGS. 2A/2C can be printed over the printed and cured dielectric from 345 and 350. The gate electrode can be printed using any highly conductive material. In certain embodiments, the gate electrode can be printed using a metal nanoparticles, such as gold nanoparticles, silver nanoparticles, copper nanoparticles, aluminum nanoparticles, or combinations thereof or conductive polymers, such as poly(3,4-ethylenedioxythiophene) polystyrene sulfonate (PEDOT:PSS) aqueous solution. In certain embodiments, additives and/or processing aids can be added. For examples, additives that can increase the conductivity can be added.

In 360, the printed gate electrode from 355 can be cured. In certain embodiments, the printed gate electrode can be annealed at a temperature of 105° C.~140° C. for 30~60 minutes.

In 365, a protective layer 130 shown in FIG. 1C or 230 shown in FIGS. 2C/2D can be printed over desired, preselected regions. In certain embodiments, the protective layer can include a dielectric polymer, such as polyimide, TEFLON, CYTOP, poly(methyl methacrylate), and so on; a dielectric oxide; or a dielectric nitride. In certain embodiments, the protective layer can be printing using a solution of the dielectric material dissolved in a suitable solvent, such as ethyl acetate.

In 370, the protective layer can be cured. In certain embodiments, the protective layer is annealed at a temperature of in the range of 100° C.-140° C. for 10~30 minutes.

In 375, a pixel electrode 120 shown in FIGS. 1A-1C or 220 shown in FIGS. 2A-2C can be printed. In certain embodiments, the pixel electrode can be printed using a metal nanoparticles, such as gold nanoparticles, silver nanoparticles, copper nanoparticles, aluminum nanoparticles, or combinations thereof or conductive polymers, such as poly(3,4-ethylenedioxythiophene) polystyrene sulfonate (PEDOT:PSS) aqueous solution.

In 380, the printed pixel electrode can be cured. In certain embodiments, the pixel electrode is annealed at a temperature of in the range of 100° C.-140° C. for 10~30 minutes.

EXAMPLES

Aerosol Jet Printing

Figure 4:
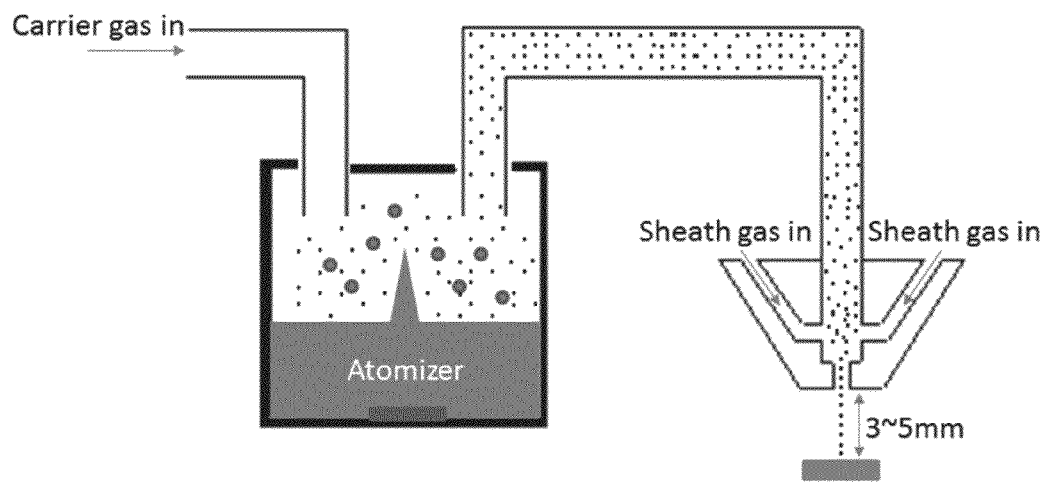
FIG. 4 is a diagram of an aerosol jet printing in accordance with certain embodiments.

All materials were printed using Aerosol Jet Printer. Generally, the solution of materials was atomized using either ultrasonic or pneumatic atomizer, creating a dense aerosol composed of droplets with diameters between approximately 1 and 5 microns. The carrier gas was used to transport aerosol from an atomizer to deposition head where aerosol was focused by an annular sheath gas. The co-axial flow between the aerosol stream and a sheath gas stream exited the deposition head through a nozzle directed at the substrate (FIG. 4). The deposition of complex patterns on the substrate was accomplished through a mechanical shutter and computer-controlled precision motion platen driven by vector based tool paths, which were converted from a written pattern in a standard .dxf file, generated using a computer-aided design (CAD) program. To align different layers, fiducial markers were written in files and ran before printing the different patterns. The fiducial markers were able to provide control of the off-set within 1-2 microns. Once deposited, the patterns were post treated (e.g., drying, sintering, curing) to achieve their final properties.

Materials and Conditions

Gold nanoparticle inks (UTAu40 X) were purchased from UTDots, with particle size of 4 nm and 40% concentration in weight dispersed in xylene. Before atomizing, terpineol was added into gold nanoparticle ink in volume ratio of 15/85 (terpineol/gold nanoparticle ink). Dependent upon the atomizing conditions, the ink can be slightly diluted by adding chlorobenzene or xylene. The atomizing voltage was among the range of 26 V to 48 V. Empirically, the sheath gas flow was 25 ccm, and carrier gas flow was 17 ccm (cubic centimeters per minute). The moving speed of platen was from 0.2 mm/s to 10 mm/s dependent on the flow rate of gold nanoparticle inks. The fine aerosol droplet sizes of 1-5 microns was able to print features as small as 10 microns with clean edge, even thickness and smooth profiles using 100 μm nozzle. After deposition, the patterned gold nanoparticle features such as thin film transistor electrodes and data lines were cured at 300° C.-400° C. for 30 minutes.

Polyimide was used as insulating material between gold lines. The employed polyimide solution was obtained by dissolving Corin XLS purchased from Mantech Materials in N-Methyl-2-Pyrrolidone (NMP) in 1:2 weight ratio. The formed polyimide solution was diluted continuously with NMP and ethyl acetate for better atomization. Dependent on the viscosity of polyimide ink, the atomized voltage was tunable from 24 V to 48 V, and sheath gas flow from 20 ccm to 35 ccm, carrier gas flow from 10 ccm to 25 ccm. The speed of platen motion was controlled to be between 0.2 mm/s to 10 mm/s in accordance to aerosol flow. The deposited polyimide patterns are annealed at 200° C. on hot plate to formed clear and transparent films.

Purple solution of 65-single chirality single-walled carbon nanotubes dispersed in 5% sodium dodecyl sulfate aqueous solution was extracted from either HIPCO single-walled carbon nanotubes or Southwest Nano Technology SG65 single-walled carbon nanotubes on GE Sephacryl S-200 gel column. SDS aqueous solution was atomized at low voltage of 24 V. Aerosol with SDS was easily condensed to form large liquid droplet causing uncontrolled spray. To eliminate this overspray, small quantity of methanol was added. Sheath gas flow was adjusted up to 35 ccm to have 65-single-walled carbon nanotube solution focused inside thin film transistor channels by running fiducial mark alignment. Carrier gas flow of 10-20 ccm was used to control aerosol rate that directly affect the deposition speed from 0.5 mm/s to 10 mm/s. The deposited 65-single-walled carbon nanotube films (which appeared to be white) were treated in acid vapor followed by rinsing inside isopropyl alcohol. The treated sample was then baked in hot plate at 100° C. for 10 minutes. Thin layer of uniform and clear 65-single-walled carbon nanotube films thus were obtained.

Polyfluorinated resin (Dupont) and ionic liquid alcohol solution were used to print dielectric material over the carbon nanotube films. Polyfluorinated resin was dissolved in a mixture of lower aliphatic alcohols to form 5 wt % solution. Solarpur 1-ethyl-3-methylimidezolium bis(trifluoromethyl)sulfonylimide (EMIM TFSI) was purchased from Merk. Compositions of polyfluorinated resin to EMIM TFSI in weight ratio from 1/6 to 10/1 were formulated. The formed polyfluorinated resin EMIM TFSI solution was further diluted with methanol for easy atomization. Based on the viscosity of polyfluorinated resin EMIM TFSI solution, the atomized voltage was adjusted from 20 V to 48 V, sheath gas flow range from 20 ccm to 35 ccm, and carrier gas flow range from 10 ccm to 20 ccm. The deposition was controlled by the speed of platen movement which was in the range of 0.2 mm/s to 10 mm/s. The deposited polyfluorinated resin EMIM TFSI were annealed at >200° C. on hot plate to form a hard transparent film.

Poly(3,4-ethylenedioxythiophene) Polystyrene sulfonate (PEDOT:PSS) was printed as top gate electrode on dielectrics. The employed PEDOT:PSS was Clevios™ PH-1000 from Heraeus. To increase the conductivity of PH-1000, DMF or ethylene glycol can be added. PH-1000 aqueous solution was further diluted with deionized water and methanol to make it atomize more easily. Similarly, according to the viscosity of PH-1000, the atomized voltage was adjusted from 20 V to 48 V, sheath gas flow ranged from 25 ccm to 35 ccm and carrier gas flow from 10 ccm to 20 ccm. By adjusting the platen motion speed, different gate electrodes in thickness were achieved. The deposited PH-1000 patterns were baked at 105° C. in vacuum oven for 1 hour.

Poly(methyl methacrylate) (PMMA) was used to encapsulate the printed transistors and electrodes. PMMA (Mw: 10,000) was purchased from Sigma-Aldrich. PMMA was dissolved in ethyl acetate to form 1 mg/mL solution. PMMA solution was further diluted with ethyl acetate to make it atomize more easily. PMMA solution was atomized in the range of 20-48 V, with sheath gas flow of 25-50 ccm and carrier gas flow of 10-25 ccm. The deposition speed was around 1-10 mm/s, controlled by the platen movement. The printed PMMA patterns were annealed at 120° C. on hotplate for 30 minutes.

PEDOT:PSS was printed as pixel electrodes. The employed PEDOT:PSS was Clevios™ PH-1000 from Heraeus. To increase the conductivity of PH-1000, DMF or ethylene glycol can be added. PH-1000 aqueous solution was further diluted with deionized water and methanol to make it atomize more easily. Similarly, according to the viscosity of PH-1000, the atomized voltage was adjusted from 20 V to 48 V, sheath gas flow ranged from 25 ccm to 35 ccm and carrier gas flow from 10 ccm to 20 ccm. By adjusting the platen motion speed, different gate electrodes in thickness were achieved. The deposited PH-1000 patterns were baked at 105° C. in vacuum oven for 1 hour.

Fully Printed SWCNT TFT Devices

In order to demonstrate the feasibility of fully printed SWCNT TFT devices, several SWCNT TFT devices were printed, without the addressing electrodes.

I. Printed Gold Nanoparticle Electrodes

Figure 5A:
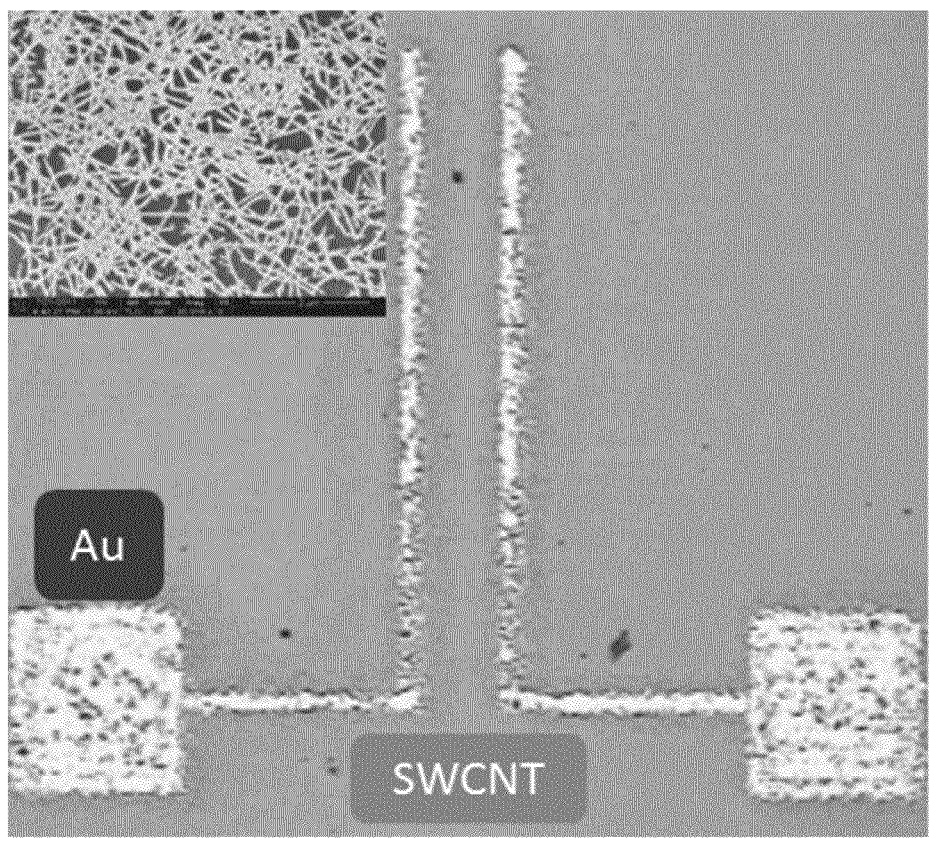
FIGS. 5A-5E show images taken after different steps of printing a thin film transistor (TFT) in accordance with certain embodiments.

First, gold nanoparticle electrodes were printed. The printed TFT gold nanoparticle electrodes with channel length of 50 µm are shown in FIG. 5A. Using aerosol jet printing, the channel length of printed gold nanoparticle electrodes can go down to 20 µm. Thereafter, the printed electrodes were annealed at 300° C. for 30 minutes, leading to electrodes that were uniform and smooth (FIG. 5A).

II. Printed 65 SWCNT Films Inside TFT Channel

Figure 5B:
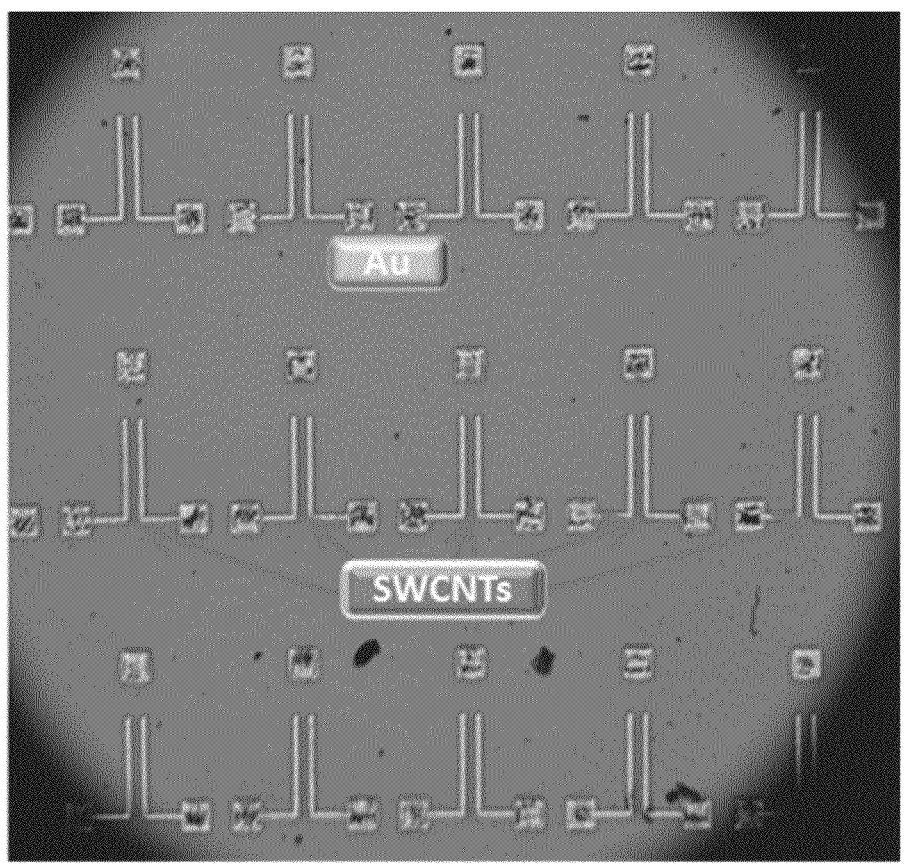

Similarly, 65-SWCNT purple solution was aerosol jet printed inside these printed gold electrodes to form white powder strips. To ensure the alignment, fiducial management was performed to align markers. FIG. 5B shows a plurality of such 65-SWCNT that were printed between gold electrodes. The white powder strips were treated under acid vapor, and then washed with isopropyl alcohol. The clear and dense 65 SWCNT network was imaged with scanning electron microscope (SEM) (see inset of FIG. 5A).

III. Printed Gate Dielectric

Figure 5C:
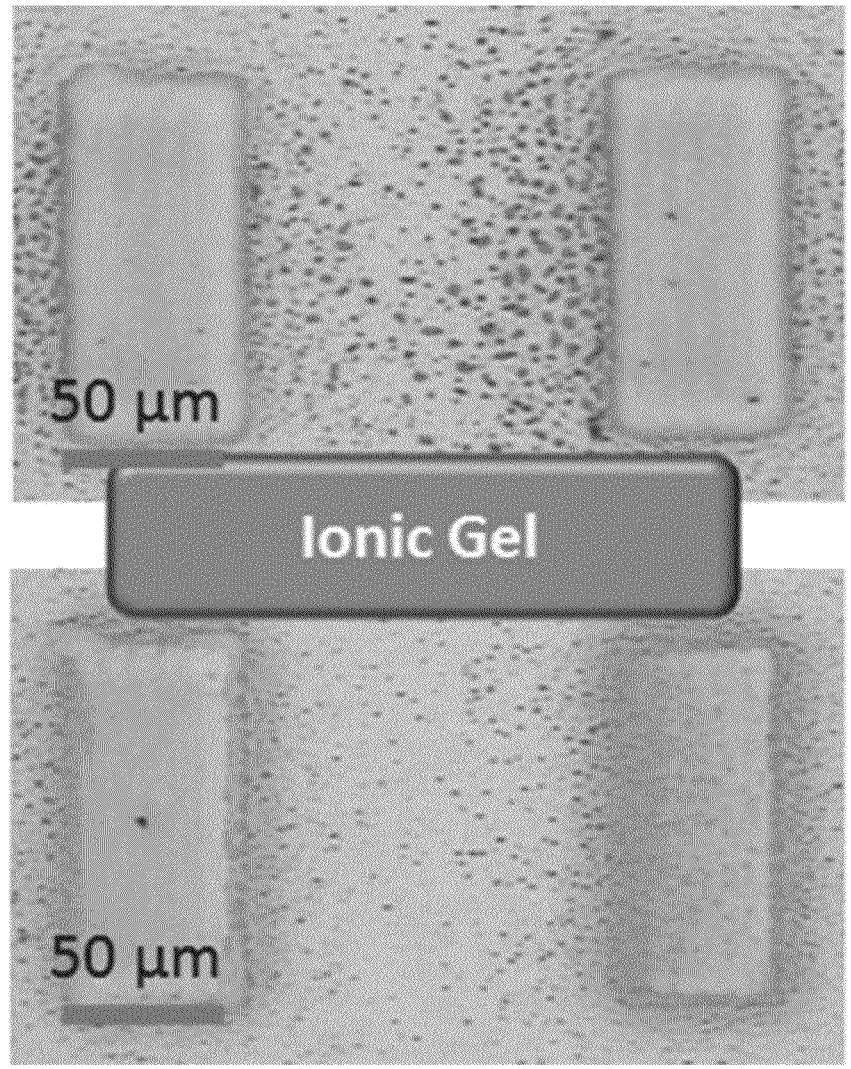

Polystyrene-co-poly(methyl methacrylate)-co-polystyrene (PS-b-PMMA-b-PS)/1-ethyl-3-methylimidazolium bis (trifluoromethylsulfonyl)imide (EMIM TFSI) ionic gel was aerosol jet printed on the top of 65 SWCNT films after running fiducial management. Thereafter, the printed ionic gel patterns were annealed at 105° C. for 30 minutes on a hot plate. As shown in FIG. 5C, clear and transparent gels were imaged under optic microscope.

Figure 5D:
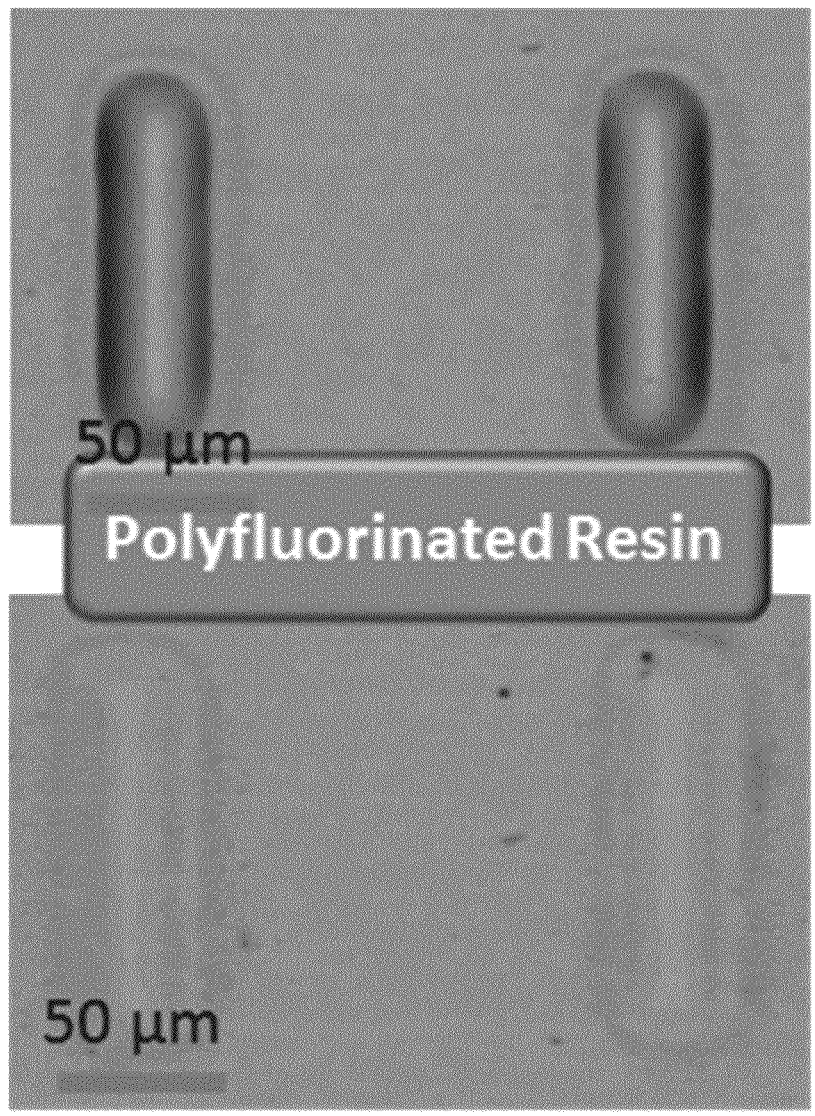

Alternatively, polyfluorinted resin/EMIM TFSI was also utilized as the gate dielectric. Polyfluorinated resin/EMIM TFSI solution was aerosol jet printed on the top of 65 SWCNT films in the same way as PS-b-PMMA-b-PS/EMIM TFSI. The printed polyfluorinated resin/EMIM TFSI patterns were annealed at 200° C. for 30 minutes on hot plate. As shown in FIG. 5D, the optical images show a clear and transparent hard film. Moreover, as shown in below, it is contemplated that the by-product $CF_3SO_3H$ becomes vaporized due to its boiling point of 160° C. The gate sheet capacitance was estimated to be 10 µF/cm² arising from the generation of 1 nm thick electric double layers (EDL) under applied gate potentials, similar to that of PS-b-PMMA-b-PS/EMIM TFSI ionic gel.

IV. Printed Gate Electrodes

Figure 5E:
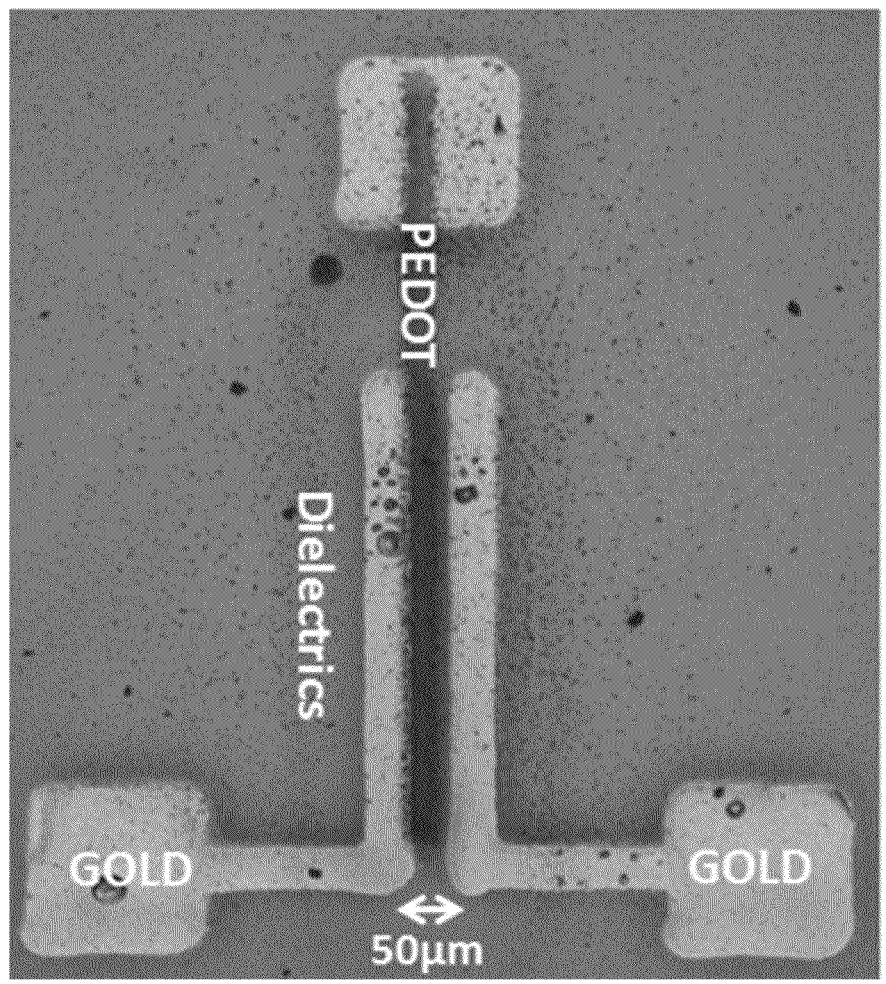

To complete TFT, poly(3,4-ethylenedioxythiophene) PEDOT/polystyrene sulfonate (PSS) lines were fabricated by aerosol jet printing Clevois PH-1000 solution on the top of polyfluorinated resin/EMIM TFSI gate dielectrics. The printed PEDOT/PSS top electrodes were annealed at 140° C. under vacuum for one hour. As shown in FIG. 5E, the fully printed 65 SWCNT TFT was imaged under optic microscope.

Figure 5F:
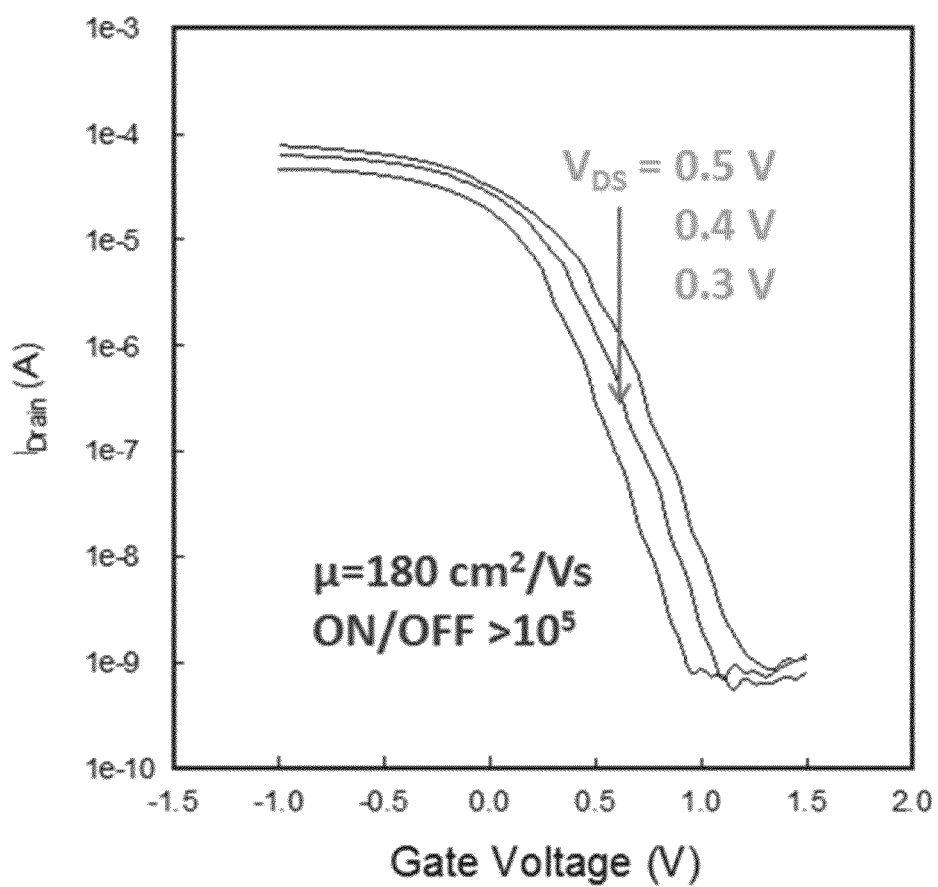
FIG. 5F shows a mobility of the TFT in accordance with certain embodiments.

The fully printed TFT devices were then characterized on Keithley 4200 SCS showing high conductance of 0.1 mA and decent ON/OFF ratio>$10^5$ under sub-2 voltages. As shown in FIG. 5F, the mobility was estimated to be 180 cm²/Vs by applying sheet capacitance of gate dielectrics of 10 g/cm².

Figure 5G:
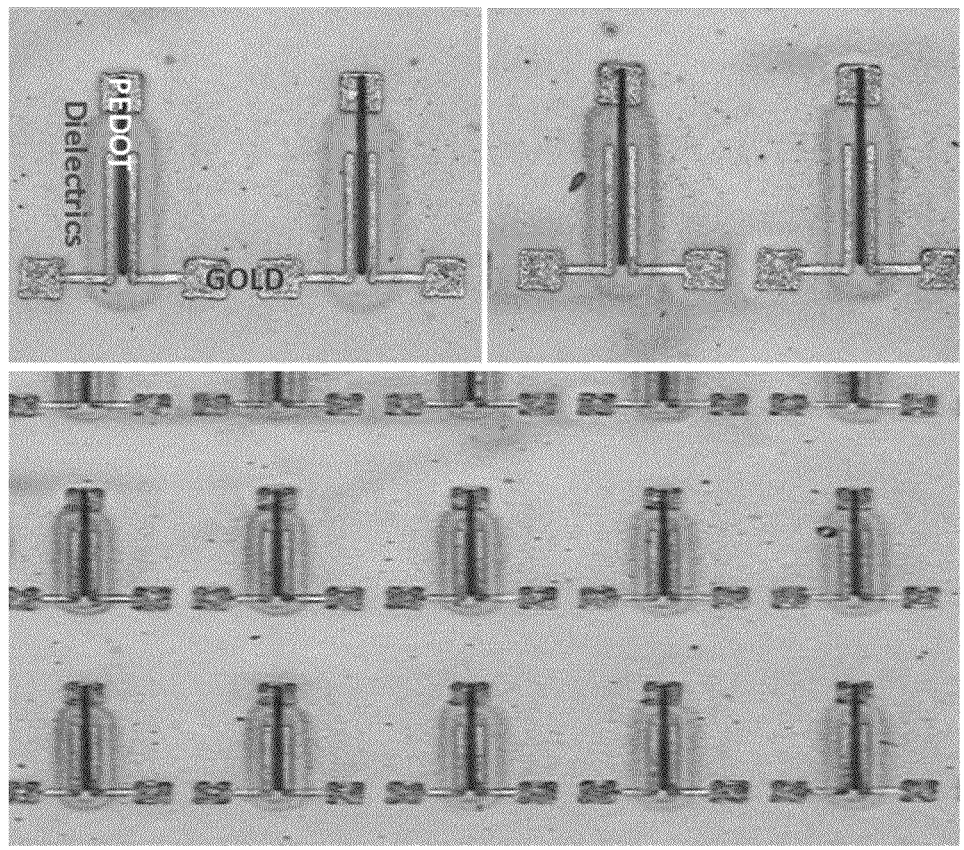
FIG. 5G shows the reproducibility of the printing method in printing multiple TFTs in accordance with certain embodiments.

Moreover, as shown in FIG. 5G, these fully printed top-gated SWCNT TFTs were reliable when printed in a large scale. Figure of Merits as obtained from these materials are shown in Table below.

| Figures of Merit (Metrics) | Units | Current Values (65 SWCNT TFTs) |
|---|---|---|
| 65-SWCNTs | % | >95 |
| 65-SWCNT length | µm | >1 |
| 65-SWCNT supplier | SWCNT | House-Prepared |
| ink viscosity | mPa·s | <15 |
| 65 SWCNT-ink lifetime | days (free aggregation) | >180 |
| 65 SWCNT thickness | µm | <10 |
| 65 SWCNT printing density | tubes/µm² | >30 |
| dielectric thickness | µm | 10 |
| line width minimum | µm | 10 |
| alignment error | ±µm | 5 |
| Ink solution type | Gold | UTDots |
| resistivity (metallic) | Ω/□ | ~1 |
| Mobility | cm²/Vs | 147 |
| gate leakage current | pA/cm² | <10 |
| On/Off ratio | Ratio | 5 × 10⁵ |
| oscillator speed | KHz | >2k |
| Vdd | V | <3 |

Printing Grids of Gold Nanoparticle Lines Insulated by Polyimide Layer

Figure 6A:
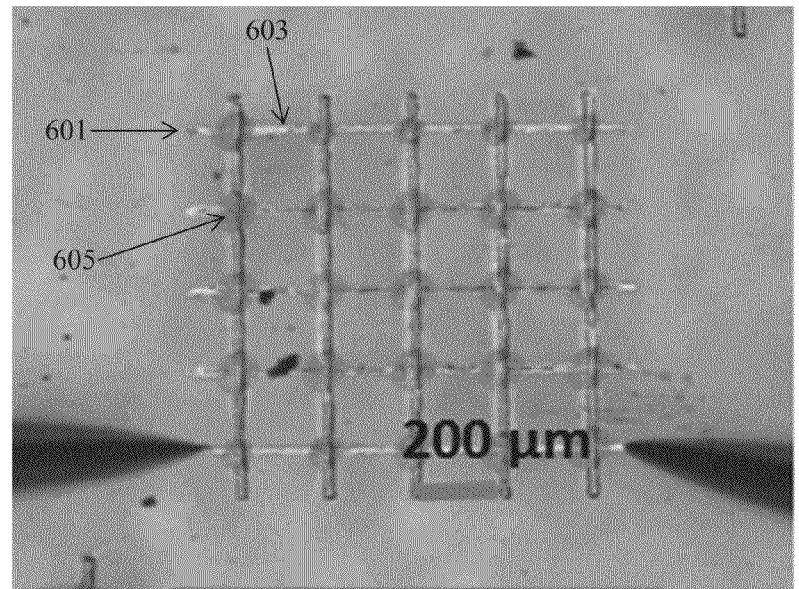
FIGS. 6A through 6C measures the conductive across and between the gold electrodes that have been printed in accordance with certain embodiments.
Figure 6A:
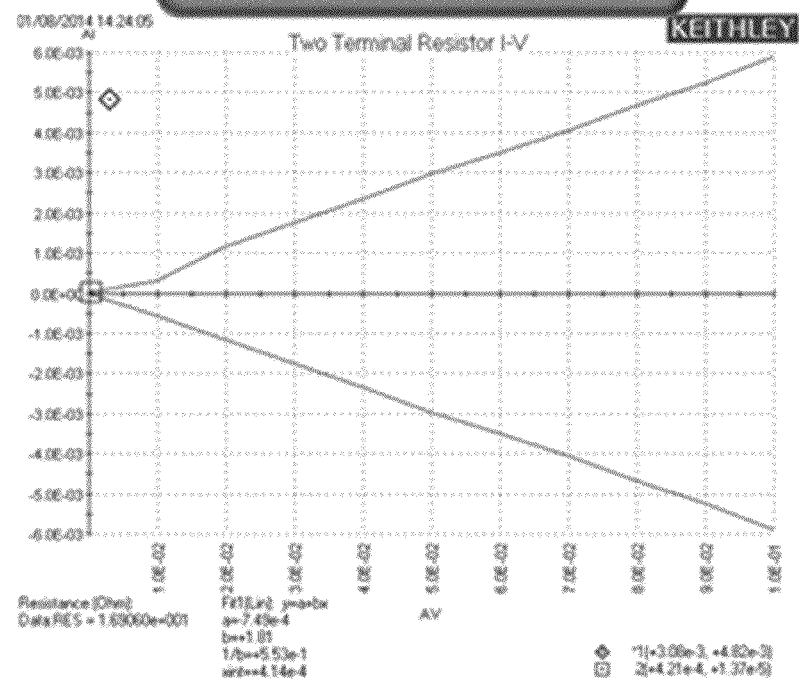
Figure 6B:
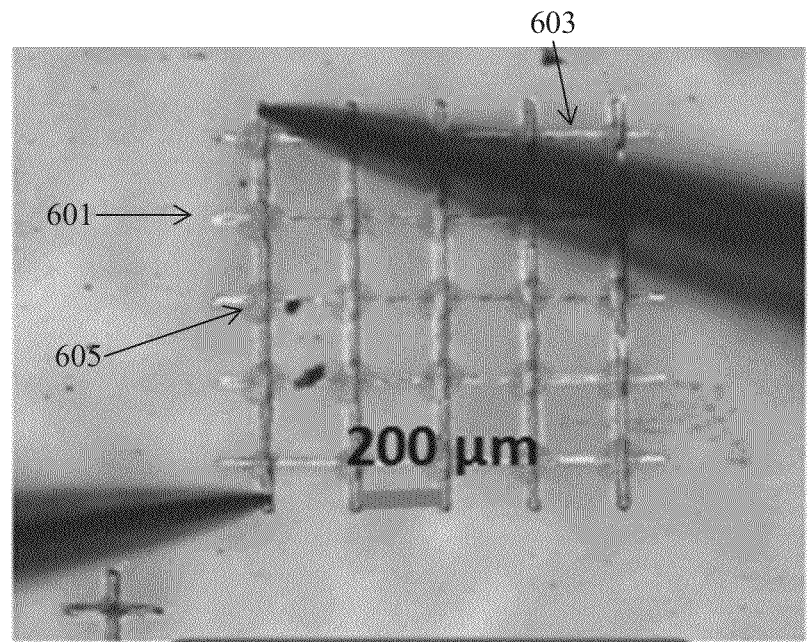
Figure 6B:
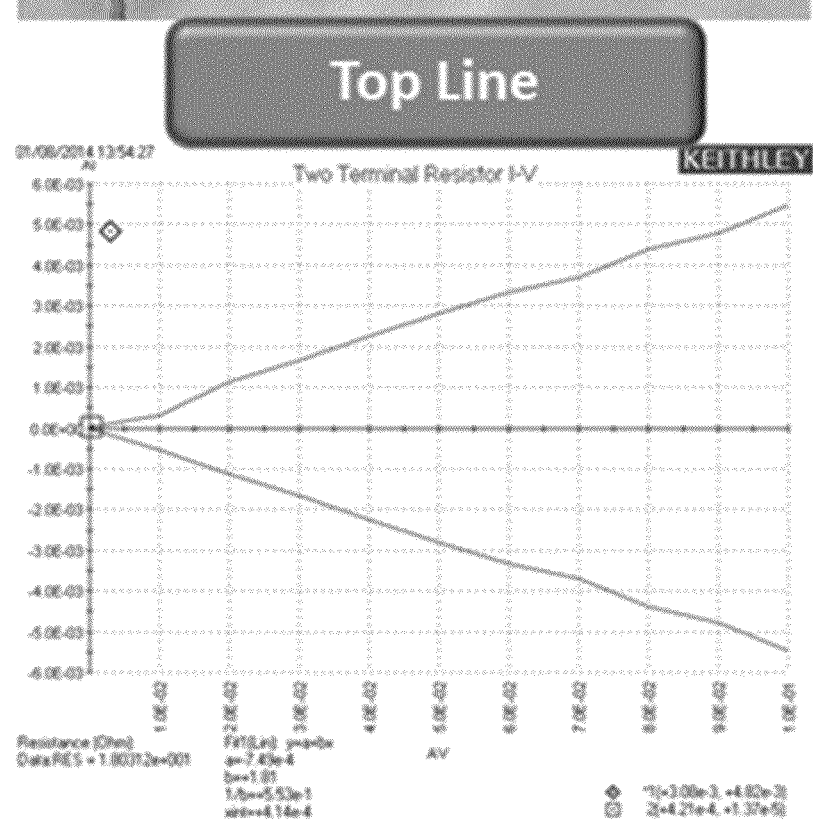
Figure 6C:
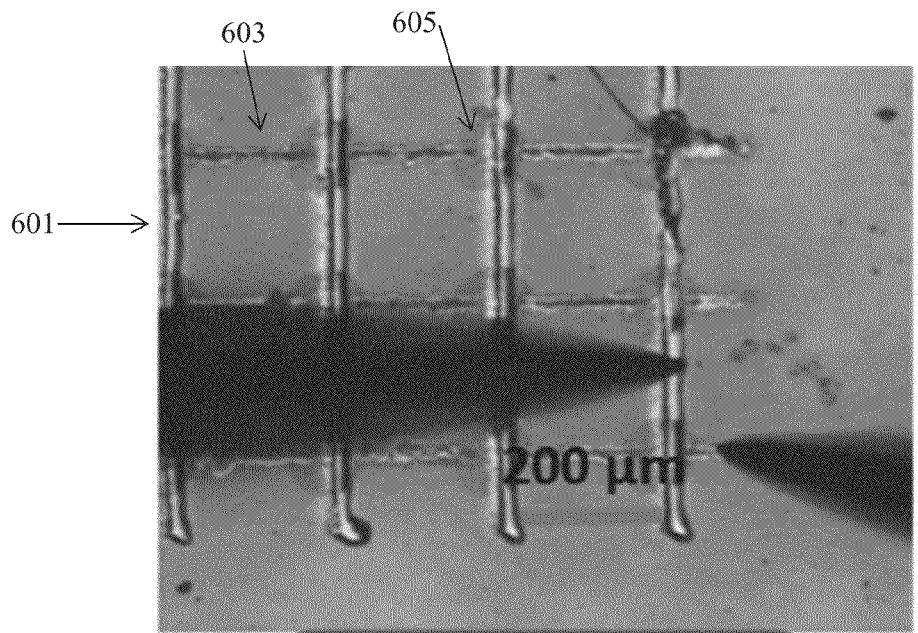
Figure 6C:
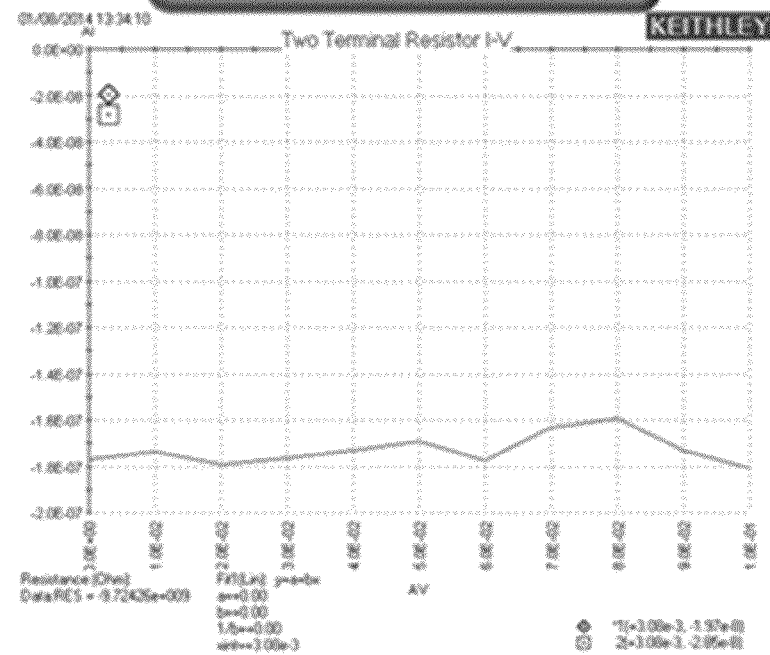

To demonstrate the feasibility of printing addressing electrodes, a grid containing vertical gold lines (layer 1 or bottom layer), insulating patches (layer 2) and horizontal gold lines (layer 3 or top layer) were printed. FIGS. 6A through 6C show grid lines of 200 µm×200 µm cells printed from gold nanoparticles and insulated by printed polyimide layers at crossing points.

First, vertical gold nanoparticle lines 601 were printed using aerosol printing, and were then sintered at 300° C. for 30 minutes.

Second, polyimide patches 605 of 50 μn×50 μm were printed periodically along the vertical gold nanoparticle lines, and then cured at 180° C. for 10 minutes.

Third, horizontal gold nanoparticle lines 603 were printed, and then sintered at 300° C. for 30 minutes.

Under optic microscopy, the printed polyimide patches 605 are clearly observed in between vertical and horizontal printed gold nanoparticle lines 601 and 603. The conductivities of bottom horizontal and top vertical lines, along with the resistances of intersection lines were characterized with Keithley 4200 SCS. The I-V resistive curves are shown in FIGS. 6A through 6C. The curves show both bottom horizontal and top vertical gold lines are perfectly conductive when measured along the respective lines, and are well insulated by polyimide layers when measured between the two lines.

Fully Printed SWCNT TFT Backplanes

Figure 7A:
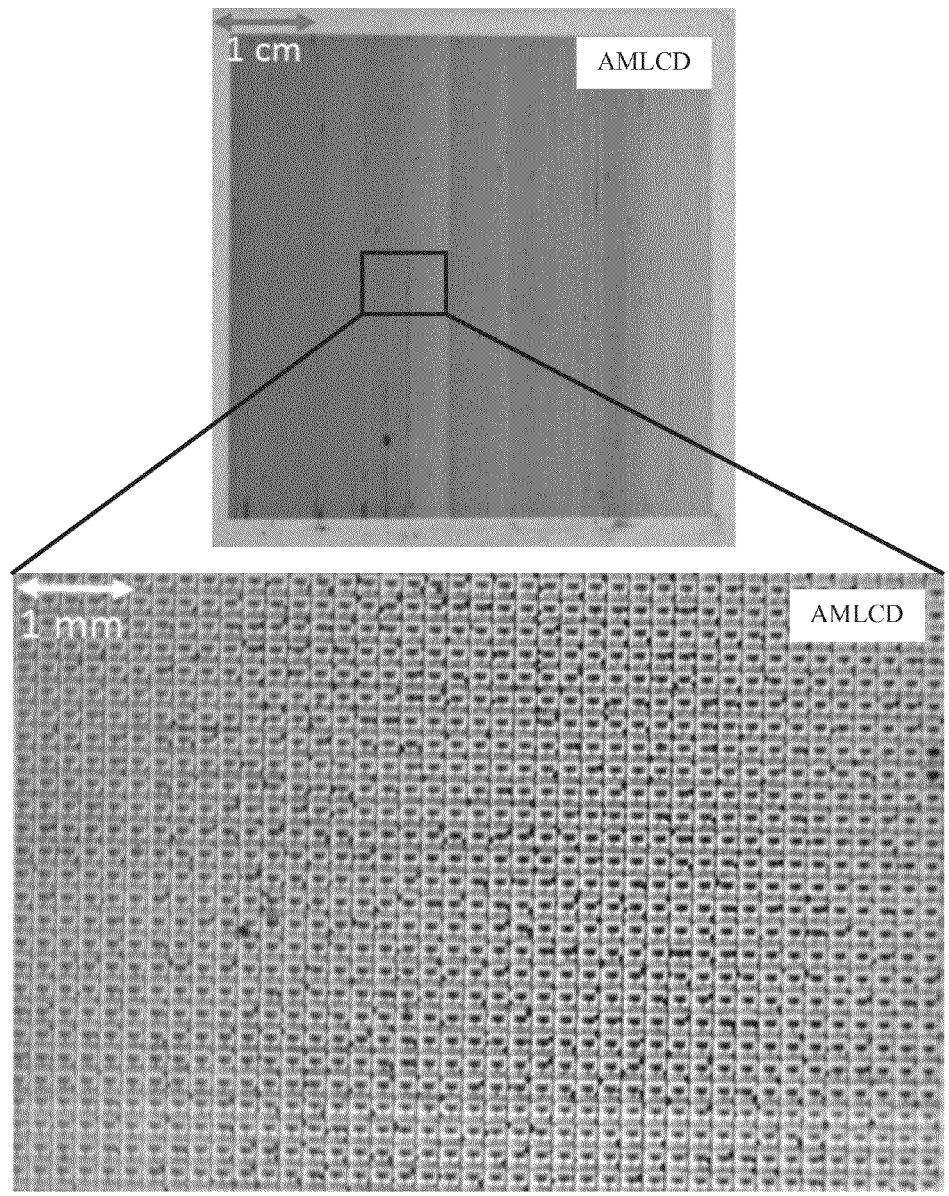
FIGS. 7A and 7B show fully printed 5 cm×5 cm SWCNT TFT backplane with pixel size of 200 µm×200 µm in accordance with certain embodiments.
Figure 7B:
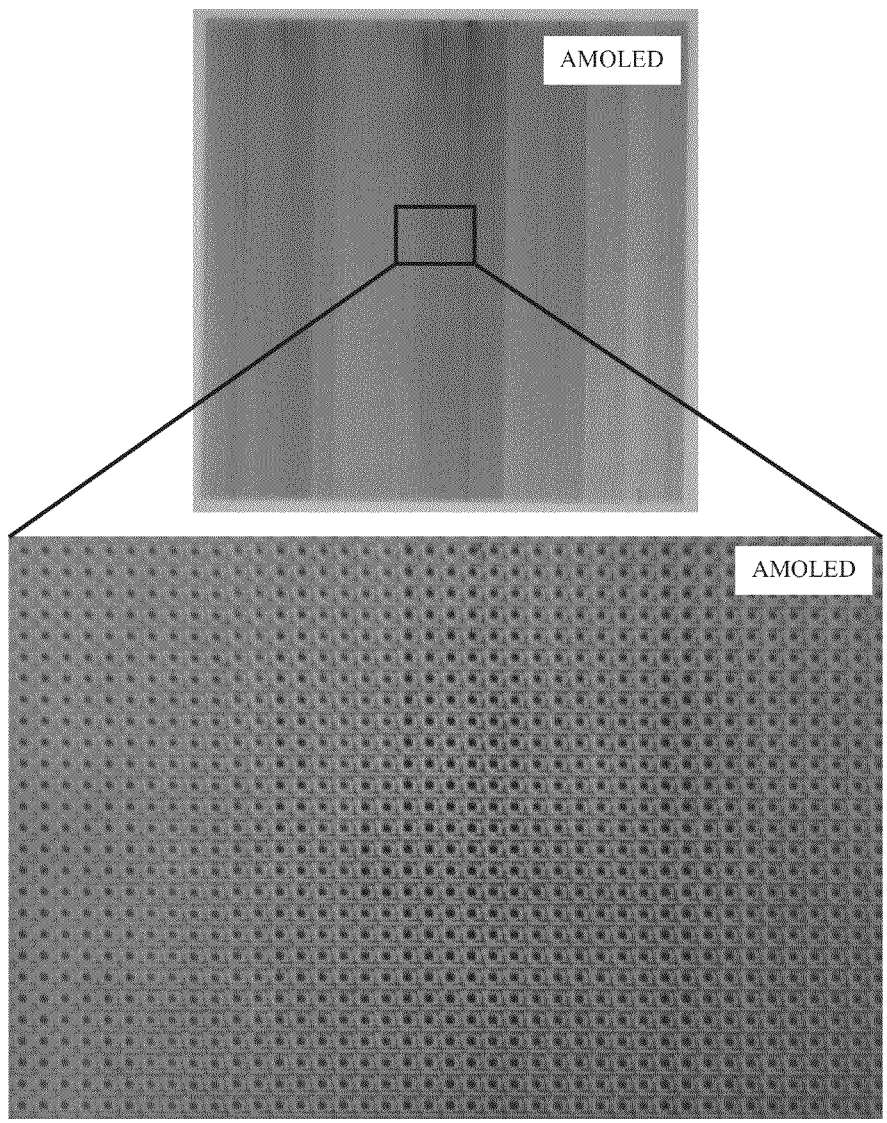

Based on the above-described successful results, and as shown in FIGS. 7A (AMLCD) and 7B (AMOLED), fully printed 5 cm×5 cm SWCNT TFT backplane with pixel size of 200 nm×200 μm was achieved. The detailed printing procedures were as follows. Fiducial management to align marks were run after each step.

(1) First, gold lines were aerosol jet printed as bottom electrodes and annealed at 300° C. for 30 minutes.

Figure 8A:
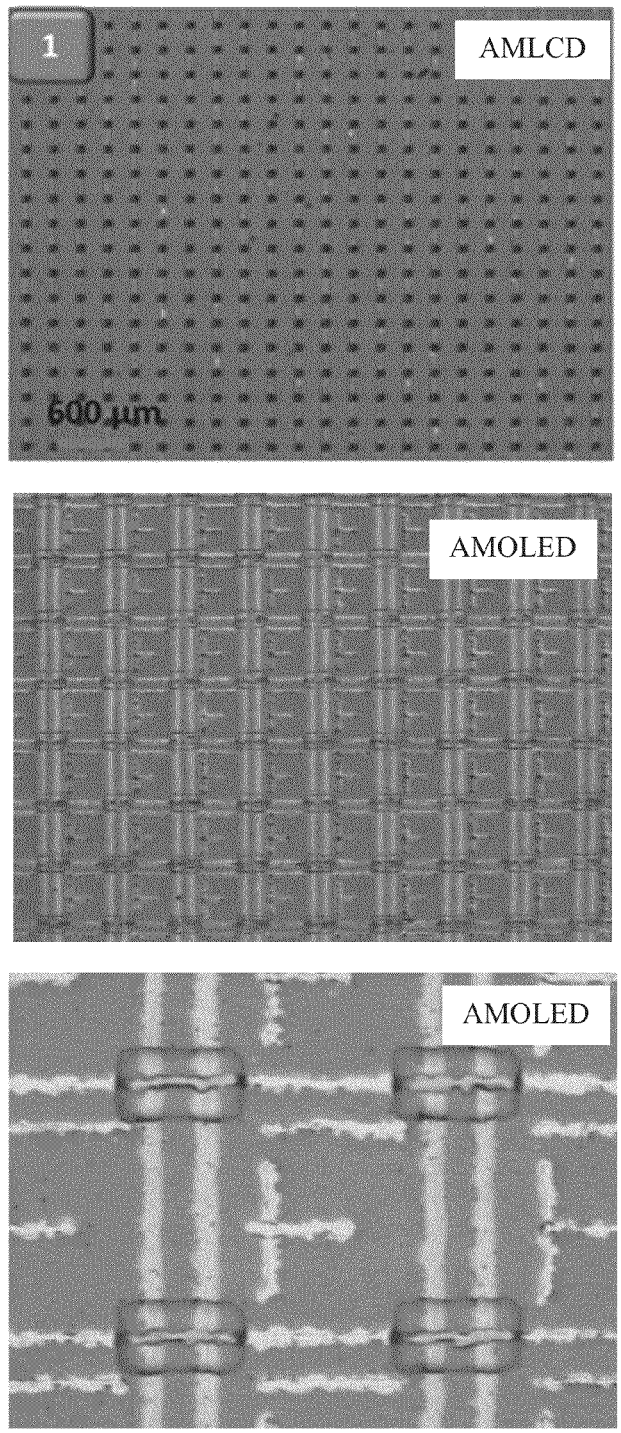

(2) Polyimide patches were aerosol jet printed atop of bottom gold lines and annealed at 180° C. for 10 minutes (shown in FIG. 8A).

(3) Gold lines and electrodes were printed as top electrodes and TFT electrodes annealed at 300° C. for 30 minutes (shown in FIG. 8B (1) and zoomed-in image FIG. 8B (2))

Figure 8C:
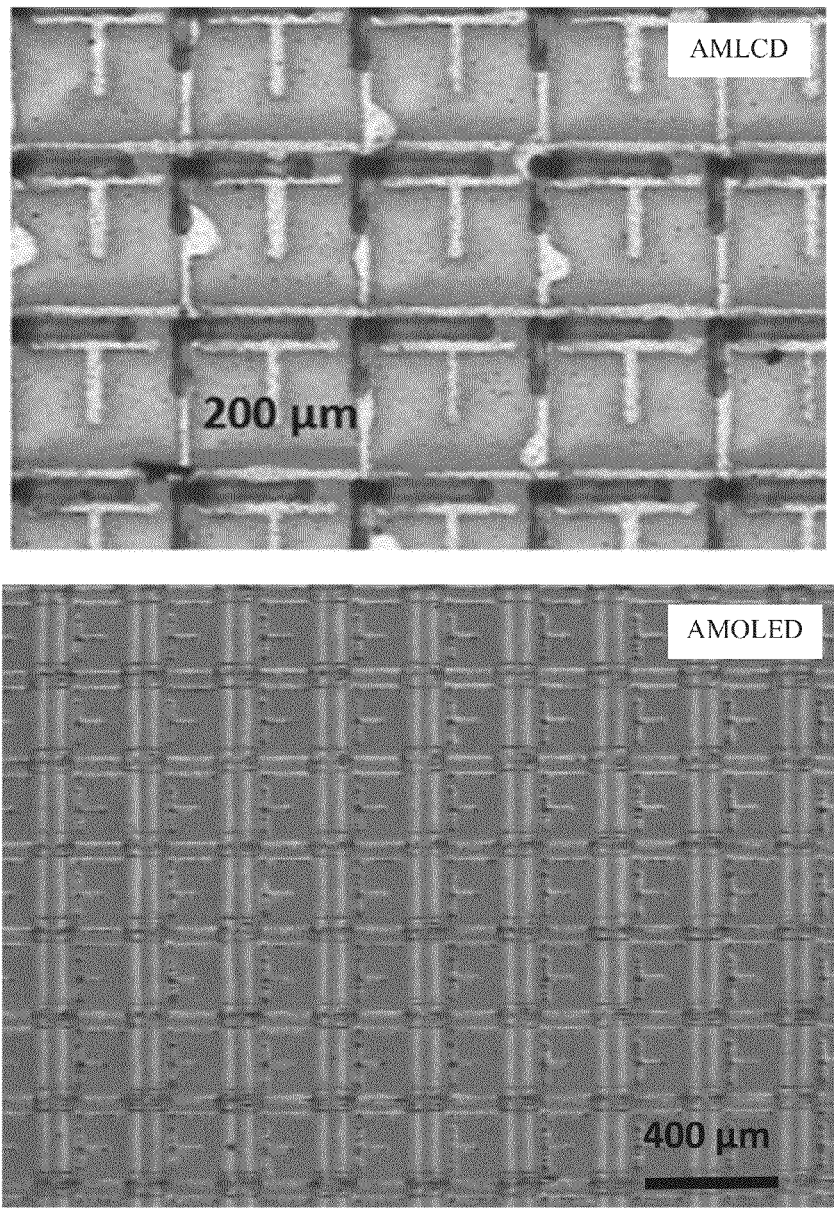

(4) The separated 65-SWCNTs were printed into TFT channels as an active layer and treated by acid vapor following with isopropyl alcohol washing (shown in zoomed-in image FIG. 8C).

(5) Polyfluorinated resin/EMIM TFSI was aerosol jet printed as dielectric layers and annealed at 200° C. for 30 minutes (shown in FIG. 8D (1) and zoomed-in image FIG. 8D(2)).

Figure 8E:
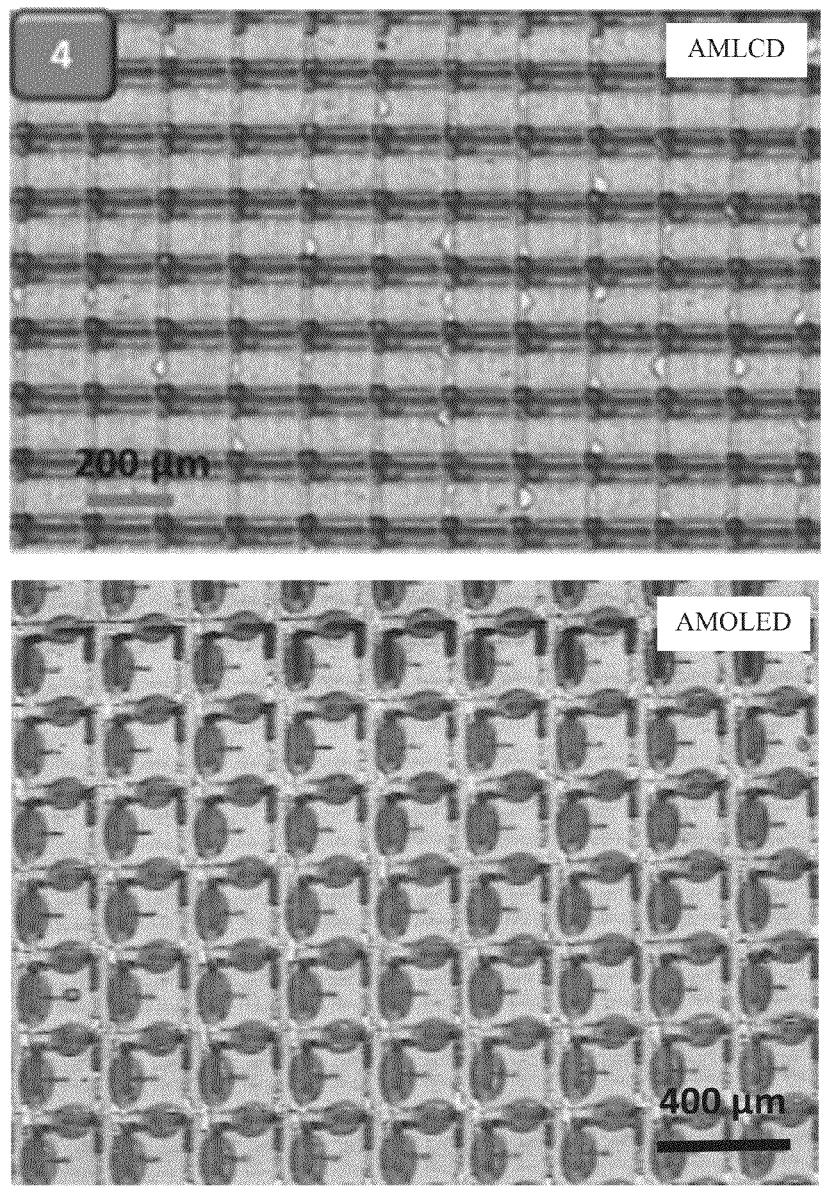

(6) PEDOTs were aerosol jet printed as top gate electrodes of TFTs after annealed at 140° C. under vacuum for one hour (shown in FIG. 8E).

Figure 8F:
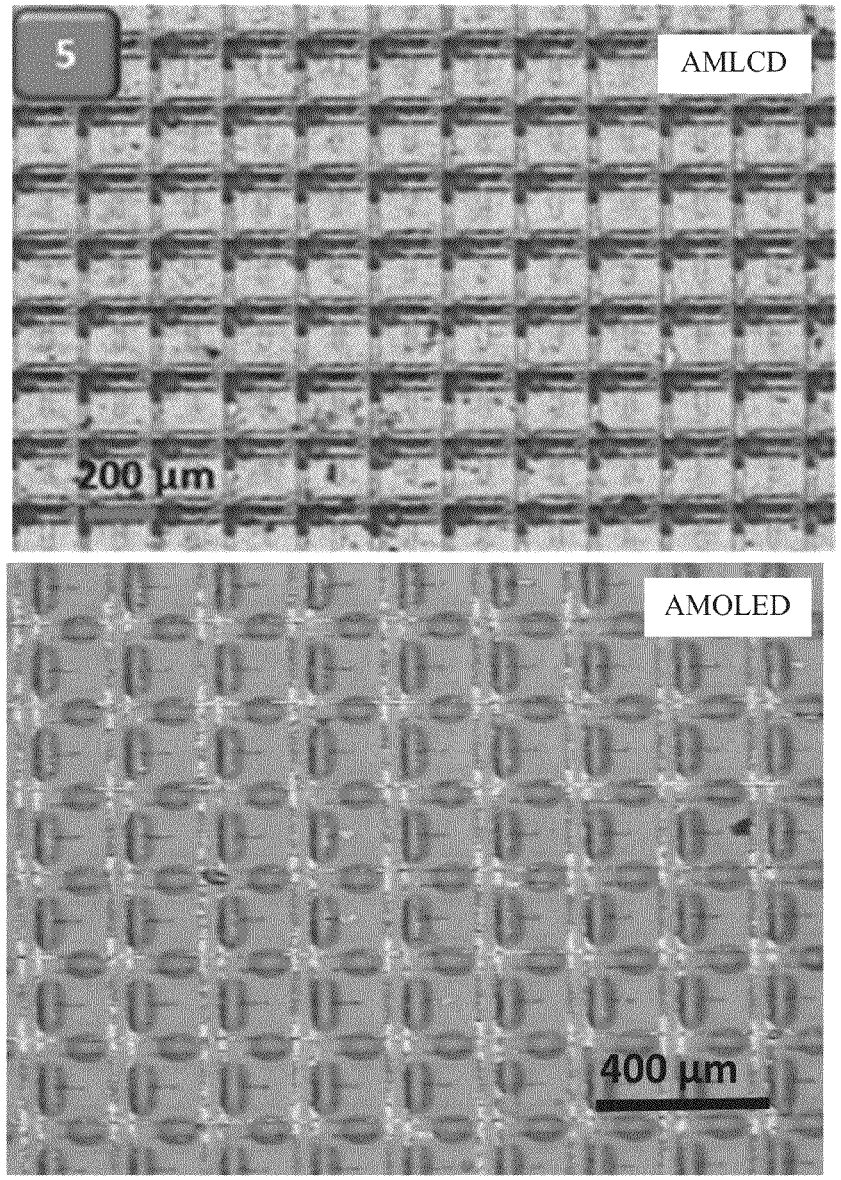

(7) PMMAs were aerosol jet printed to protect all electrodes and TFTs and annealed at 180° C. for 30 minutes (shown in FIG. 8F).

(8) PEDOT patches were printed inside pixel units as pixel electrodes for AMLCDs (shown in FIG. 8G(1) and zoomed-in image FIG. 8G(2)).

(6) Lastly, the fully printed backplane device was annealed at 140° C. under vacuum for one hour.

The fully printed SWCNT TFT backplanes produced as described herein were capable>100 cm$^2$/Vs mobility and >10$^6$ ON/OFF ratio SWCNT TFT. The backplanes were robust and printed with a 100% yield. The printed 65 SWCNT TFT backplanes can fit into current TFT-LCD mass production manufacturing line to overcome the challenges faced in current conventional technologies.

Upon review of the description and embodiments provided herein, those skilled in the art will understand that modifications and equivalent substitutions may be performed in carrying out the invention without departing from the essence of the invention. Thus, the invention is not meant to be limiting by the embodiments described explicitly above.

What is claimed is:

1. A method for depositing an active matrix thin film transistor backplane on a substrate, said thin film transistor backplane comprising a plurality of thin film transistors and addressing electrodes, the method comprising:
    printing a first gold electrode layer on the substrate, the first gold electrode layer comprising a plurality of gold lines;
    printing an insulating layer over printed gold lines, the layer comprising insulating patches at intervals along the conductive lines;
    printing a second gold electrode layer over the printed insulating layer, the second gold electrode layer comprising a plurality of gold lines perpendicular to the gold lines of the printed first gold electrode layer to form pixel cells and electrodes to provide a transistor channel at each pixel cell;
    selectively printing semiconducting carbon nanotubes in each of said plurality of transistor channels, wherein the semiconducting carbon nanotubes have a single chirality;
    selectively printing a dielectric over each of the printed semiconducting carbon nanotubes, wherein said dielectric comprises an ionic gel;
    printing gate electrodes over said dielectric to form a plurality of thin film transistor, wherein said gate electrode comprises a conducting polymer; and
    printing pixel electrodes in electrical connection with an electrode of said thin film transistors.

2. The method of claim 1, further comprising:
    printing a protective layer over at least said first and second conductive layers and said plurality of thin film transistors.

3. The method of claim 1, wherein said semiconducting carbon nanotubes comprise single-walled carbon nanotube.

4. The method of claim 3, wherein said semiconducting carbon nanotubes comprise 65 single-walled carbon nanotubes (SWCNT), 91 SWCNT, 83 SWCNT, 65 SWCNT, 73 SWCNT, 75 SWCNT, 102 SWCNT, 84 SWCNT, 76 SWCNT, and 92 SWCNT.

5. The method of claim 4, wherein said semiconducting carbon nanotubes comprise 65 single-walled carbon nanotubes.

6. The method of claim 5, wherein said 65 single-walled carbon nanotubes are contained in a solution having a concentration of 0.001 to 0.1 mg/mL in 1%-5% SDS aqueous solution.

7. The method of claim 3, further comprising:
    washing said active channel material with acid vapor.

8. The method of claim 7, further comprising:
    washing said active channel material with an alcohol.

9. The method of claim 3, further comprising:
    heating said active channel material at a temperature of 105° C.~140° C.

10. The method of claim 1, wherein said each of said printing is carried out using an aerosol jet printing, ink jet printing, screen printing, flexography printing, or combinations thereof.

11. The method of claim 1, wherein said gold nanoparticles have a size of that ranges from about 1-20 nm and the gold nanoparticles are dispersed in an organic solvent at a concentration of about 5-60 weight %).

12. The method of claim 11, wherein said organic solvent comprises xylene, toluene, chlorobenzene, dichlorobenzene, trichlorobenzene, triethylbenzene, chloronaphthalene or combinations thereof.

13. The method of claim 1, wherein said insulating layer comprises a dielectric polymer, dielectric oxides, dielectric nitride, or combinations thereof.

14. The method of claim 13, wherein said dielectric polymer comprises polyimide, fluorinated polymer, poly(methyl methacrylate), or combinations thereof.

15. The method of claim 14, wherein said dielectric polymer comprises polyimide and the polyimide is dispersed in an N-Methyl-2-Pyrrolidone, N,N-dimethylformide, or combinations thereof.

16. The method of claim 1, wherein said dielectric comprises a gelling polymer and an ionic liquid in the ratio from 1:5 to 10:1.

17. The method of claim 1, wherein said dielectric comprises a gelling polymer and 1-alkyl-3-methyl-imidozalium counter anion.

18. The method of claim 17, wherein said dielectric comprises polyfluorinated resin and 1-ethyl-3-methylimidezolium bis(trifluoromethyl)sulfonylimide (EMIM TFSI) in an organic ionic liquid.

19. The method of claim 18, wherein said polyfluorinated resin comprises a sulfonated tetrafluorotethylene based fluoropolymer-copolymer.

20. The method of claim 17, wherein said dielectric comprises polystyrene-co-poly(methyl methacrylate)-co-polystyrene (PS-b-PMMA-b-PS) and 1-ethyl-3-methylimidezolium bis (trifluoromethyl)sulfonylimide (EMIM TFSI) in an organic ionic liquid.

21. The method of claim 1, wherein said conductive polymers for use as a gate electrode comprise poly(3,4-ethylenedioxythiophene) polystyrene sulfonate (PEDOT:PSS) aqueous solution.

22. The method of claim 2, wherein said protective layer comprises a dielectric polymer, a dielectric oxide, or a dielectric nitride.

23. The method of claim 22, wherein said dielectric polymer comprises polyimide, fluorinated polymer, Cytop, poly (methyl methacrylate), or combinations thereof.

24. The method of claim 1, wherein said pixel electrodes are printed using metal nanoparticles or conductive polymers.

25. The method of claim 24, wherein said conductive polymers comprise poly(3,4-ethylenedioxythiophene): polystyrene sulfonate (PEDOT:PSS) in an aqueous solution.

26. A backplane display prepared according to the method of claim 1, wherein the display comprises at least 1000 TFTs, each TFT having a dimension of 100 μm×100 μm to 200×200 μm.

27. The display of claim 26, wherein the TFTs have a mobility of greater than or equal to 100 $cm^2$/V-s.

28. The display of claim 26, wherein the TFTs have a mobility of 100-200 $cm^2$/V-s.

29. The display of claim 26, wherein the yield of TFTs is greater than 99%.

30. The display of claim 26, wherein the ON/OFF switching ratio of the TFTs is greater than $5 \times 10^5$.

* * * * *